United States Patent
Yoshida

(10) Patent No.: US 10,741,504 B2
(45) Date of Patent: Aug. 11, 2020

(54) SEMICONDUCTOR DEVICE MANUFACTURING METHOD AND SEMICONDUCTOR WAFER

(71) Applicant: Renesas Electronics Corporation, Tokyo (JP)

(72) Inventor: Takuji Yoshida, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 239 days.

(21) Appl. No.: 15/833,315

(22) Filed: Dec. 6, 2017

(65) Prior Publication Data

US 2018/0197825 A1    Jul. 12, 2018

(30) Foreign Application Priority Data

Jan. 10, 2017    (JP) ................................. 2017-001999

(51) Int. Cl.
   *H01L 23/535*    (2006.01)
   *H01L 23/58*    (2006.01)
   (Continued)

(52) U.S. Cl.
   CPC ............ *H01L 23/562* (2013.01); *B24B 37/04* (2013.01); *H01L 21/304* (2013.01);
   (Continued)

(58) Field of Classification Search
   CPC ... H01L 23/528; H01L 23/535; H01L 23/562; H01L 23/585; H01L 21/304;
   (Continued)

(56) References Cited

U.S. PATENT DOCUMENTS

2003/0215985 A1    11/2003 Kouno et al.
2006/0014320 A1*   1/2006 Yamano .................. H01L 24/11
                                                                438/113
(Continued)

FOREIGN PATENT DOCUMENTS

JP    2007-036129 A    2/2007
JP    2015-147231 A    8/2015
JP    2015-177170 A    10/2015

OTHER PUBLICATIONS

Extended European Search Report received in corresponding European Application No. 17209026.8 dated May 23, 2018.

*Primary Examiner* — Eileen P Morgan
(74) *Attorney, Agent, or Firm* — Mattingly & Malur, PC

(57) ABSTRACT

A semiconductor wafer provided with a pseudo chip between a product chip and a pattern prohibiting region is prepared. With the edge portion of the semiconductor wafer left, the bottom surface of the inner semiconductor substrate is ground, and then, the semiconductor wafer is cut in a ring shape to remove the edge portion. Here, in the pseudo chip, a protective film covering the conductive pattern is formed on the top surface of the semiconductor substrate and the end surface of the protective film facing the pattern prohibiting region is positioned on the conductive pattern. Further, in plan view, the inner peripheral end of the edge portion is positioned in the pattern prohibiting region, and the pattern prohibiting region between the inner peripheral end of the edge portion and the pseudo chip is cut in a ring shape.

13 Claims, 21 Drawing Sheets

(51) Int. Cl.

| | | |
|---|---|---|
| *H01L 21/304* | (2006.01) | |
| *H01L 21/78* | (2006.01) | |
| *B24B 37/04* | (2012.01) | |
| *H01L 23/00* | (2006.01) | |
| *H01L 21/683* | (2006.01) | |
| *H01L 29/66* | (2006.01) | |
| *H01L 29/06* | (2006.01) | |
| *H01L 29/40* | (2006.01) | |
| *H01L 29/423* | (2006.01) | |
| *H01L 29/10* | (2006.01) | |
| *H01L 29/739* | (2006.01) | |
| *H01L 23/528* | (2006.01) | |

(52) U.S. Cl.
CPC .......... *H01L 21/6836* (2013.01); *H01L 21/78* (2013.01); *H01L 23/585* (2013.01); *H01L 29/0619* (2013.01); *H01L 29/0661* (2013.01); *H01L 29/1095* (2013.01); *H01L 29/404* (2013.01); *H01L 29/4238* (2013.01); *H01L 29/66348* (2013.01); *H01L 29/7397* (2013.01); *H01L 23/528* (2013.01); *H01L 23/535* (2013.01); *H01L 2221/6834* (2013.01); *H01L 2221/68327* (2013.01); *H01L 2221/68381* (2013.01); *H01L 2221/68386* (2013.01)

(58) Field of Classification Search
CPC . H01L 21/6836; H01L 21/78; H01L 29/0619; H01L 29/1095; H01L 29/404; H01L 29/66348; H01L 2221/68327; H01L 2221/6834; H01L 2221/68381; H01L 2221/68386; B24B 37/04; B24B 37/042
USPC .... 451/41, 285, 287; 257/E21.237, E21.238, 257/E21.24, E21.242
See application file for complete search history.

(56) References Cited

U.S. PATENT DOCUMENTS

| | | | |
|---|---|---|---|
| 2006/0019467 A1* | 1/2006 | Lee | H01L 21/78 438/462 |
| 2008/0003720 A1* | 1/2008 | Lu | H01L 21/50 438/113 |
| 2008/0242052 A1 | 10/2008 | Feng et al. | |
| 2009/0045525 A1* | 2/2009 | Matsushima | H01L 21/568 257/777 |
| 2009/0121337 A1* | 5/2009 | Abe | H01L 21/67092 257/686 |
| 2011/0156220 A1* | 6/2011 | Kogawa | H01L 21/304 257/620 |
| 2011/0278722 A1 | 11/2011 | Miki | |
| 2015/0115465 A1* | 4/2015 | Lin | H01L 21/568 257/774 |
| 2015/0221553 A1* | 8/2015 | Ouye | H01L 21/683 438/462 |
| 2015/0243607 A1* | 8/2015 | Jang | H01L 24/73 438/113 |
| 2016/0027648 A1* | 1/2016 | Urano | H01L 23/36 438/106 |
| 2016/0079203 A1* | 3/2016 | Xue | H01L 21/76898 438/110 |
| 2016/0141260 A1* | 5/2016 | Chang | H01L 25/0657 438/613 |
| 2016/0293473 A1* | 10/2016 | Yoshihara | H01L 24/37 |

\* cited by examiner

SEMICONDUCTOR DEVICE MANUFACTURING METHOD AND SEMICONDUCTOR WAFER

CROSS-REFERENCE TO RELATED APPLICATIONS

The disclosure of Japanese Patent Application No. 2017-001999 filed on Jan. 10, 2017 including the specification, drawings and abstract is incorporated herein by reference in its entirety.

BACKGROUND

The invention relates to a method of manufacturing a semiconductor device and a semiconductor wafer, and can be utilized suitably for manufacturing a semiconductor device using a technique for thinning a semiconductor wafer by grinding only an inner portion of the semiconductor wafer except for its outer periphery when grinding a rear surface of the semiconductor wafer (hereinafter, referred to as TAIKO process), in particular.

Japanese Unexamined Patent Application Publication No. 2007-036129 discloses a technique in which with a passivation film left in a region some millimeters from the outer periphery of a wafer, the passivation film on a scribe line is removed, thereafter a rear surface of the wafer is ground, and the wafer is cut along the scribe line, to cut out the individual chips.

Further, Japanese Unexamined Patent Application Publication No. 2015-147231 discloses a wafer the top surface of which is provided with a device region including a plurality of devices and an outer peripheral excessive region for surrounding the device region and the rear surface of which is provided with a ring reinforcing portion at a position corresponding to the outer peripheral excessive region.

Further, Japanese Unexamined Patent Application Publication No. 2015-177170 discloses a technique in which with a protective tape adhered to the top surface of a wafer, a dividing groove is formed in the boundary of a ring shaped convex portion and concave portion, a dicing tape is adhered to the rear surface of the wafer, the protective tape and the ring shaped convex portion are removed from the top surface, hence to divide the device forming region of the wafer into the individual devices.

The TAIKO process is effective in reducing warpage of a semiconductor wafer and avoiding intensity reduction of the wafer even when thinning the wafer to about 60 μm to 120 μm. However, when cutting the outer peripheral portion of the semiconductor wafer in a ring shape, triangular chipping occurs in the outer periphery of the remaining semiconductor wafer and this triangular chipping disadvantageously triggers crack in the remaining semiconductor wafer.

Other problems and novel characteristics will be apparent from the description of the specification and the attached drawings.

SUMMARY

In a method of manufacturing a semiconductor device according to the embodiment, at first, a semiconductor wafer including a device region, a dummy region arranged outside the device region to surround the device region, and a pattern prohibiting region arranged outside the dummy region to surround the dummy region is prepared. With the edge portion of the semiconductor wafer left there, a semiconductor substrate forming the semiconductor wafer is ground from the rear surface thereof to thin the semiconductor substrate inner than the edge portion, and then, the semiconductor wafer is cut in a ring shape to remove the edge portion. Here, in the dummy region, a protective film covering a conductive pattern is formed on the top surface of the semiconductor substrate, an end surface of the protective film facing the pattern prohibiting region is positioned on the conductive pattern, and a distance from the outer periphery of the semiconductor wafer to the protective film is larger than a distance from the same outer periphery to the conductive pattern. Further, in plan view, the inner peripheral end of the edge portion is positioned in the pattern prohibiting region and the pattern prohibiting region between the inner peripheral end of the edge portion and the dummy region is cut in a ring shape.

According to one embodiment, it is possible to improve the manufacturing yield of a semiconductor device.

DETAILED DESCRIPTION

Figure 1:
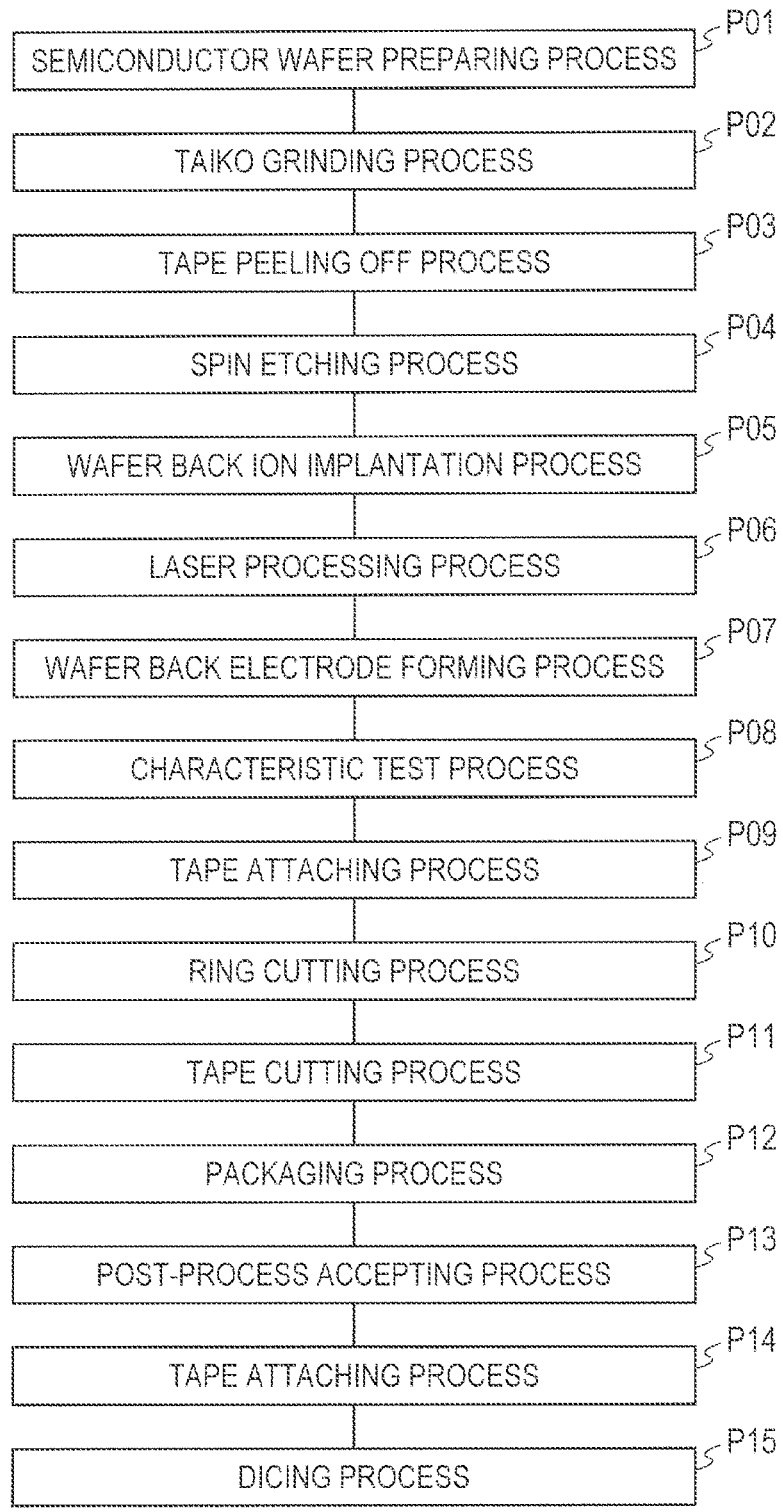
FIG. 1 is a flow chart for use in describing a method of manufacturing a semiconductor device according to one embodiment.

In the following embodiments, a description will be made by dividing into a plurality of sections or embodiments when necessary for the convenience sake, these are not unrelated to each other but are related to each other such that one covers some or all of modifies examples, applications, details, supplemental explanation and so forth of the other unless otherwise clearly specified. In addition, in the following embodiments, when the number of elements (including the number of units, a numerical value, an amount, a range and the like) is referred to, it is not limited to the specific number but may be more than or not more than the specific number unless otherwise clearly specified and unless otherwise definitely restricted to the specific number in principle.

In addition, in the following embodiments, the constitutional element (including an element step) is not necessarily indispensable unless otherwise clearly specified and unless otherwise thought to be clearly indispensable in principle. Similarly, in the following embodiments, when the shapes of the constitutional elements and their positional relationship are referred to, the ones that are substantially approximate or similar to the shapes will be included unless otherwise clearly specified and unless otherwise clearly thought that it is not so in principle. The same also applies to the abovementioned number (including the number of units, a numerical value, an amount, a range and the like).

In the following, the embodiments of the invention will be described in detail on the basis of the drawings. In all of the drawings depicted in order to describe the embodiments, the same or related codes are assigned to the members having the same functions and the repetitive description thereof is omitted. Further, when there are a plurality of similar members (portions), symbol is added to the generic code to show individual or specific portion. In the following embodiments, a description of the same or similar portion will not be repeated in principle other than the necessary time.

In the drawings used in the embodiments, hatching may be omitted to make a view easy to understand even in a cross-sectional view. On the contrary, even in a plan view, hatching may be added to make a view easy to understand.

Further, in a cross-sectional view and a plan view, each portion is not necessarily to be shown in a real size but sometimes a specific portion may be shown relatively in a large size to make a view easy to understand. Further, also when there is a correspondence between a cross-sectional view and a plan view, a specific portion may be shown in a relatively enlarged way to make a view easy to understand.

Embodiment

<Manufacturing Method of Semiconductor Device>

A method of manufacturing a semiconductor device according to the embodiment will be hereinafter described with the method divided into each process shown in FIG. 1. FIG. 1 is a flow chart for use in describing the manufacturing method of a semiconductor device according to the embodiment. In the embodiment, a semiconductor device including an Injection Enhancement (IE) trench gate Insulated Gate Bipolar Transistor (IGBT) is taken as an example of a semiconductor device; however, needless to say, it is not restricted to this.

<Process P01: Preparation of Semiconductor Wafer>

At first, a semiconductor wafer with a plurality of semiconductor devices (semiconductor chips) formed on its top surface is prepared (process P01).

Figure 2:
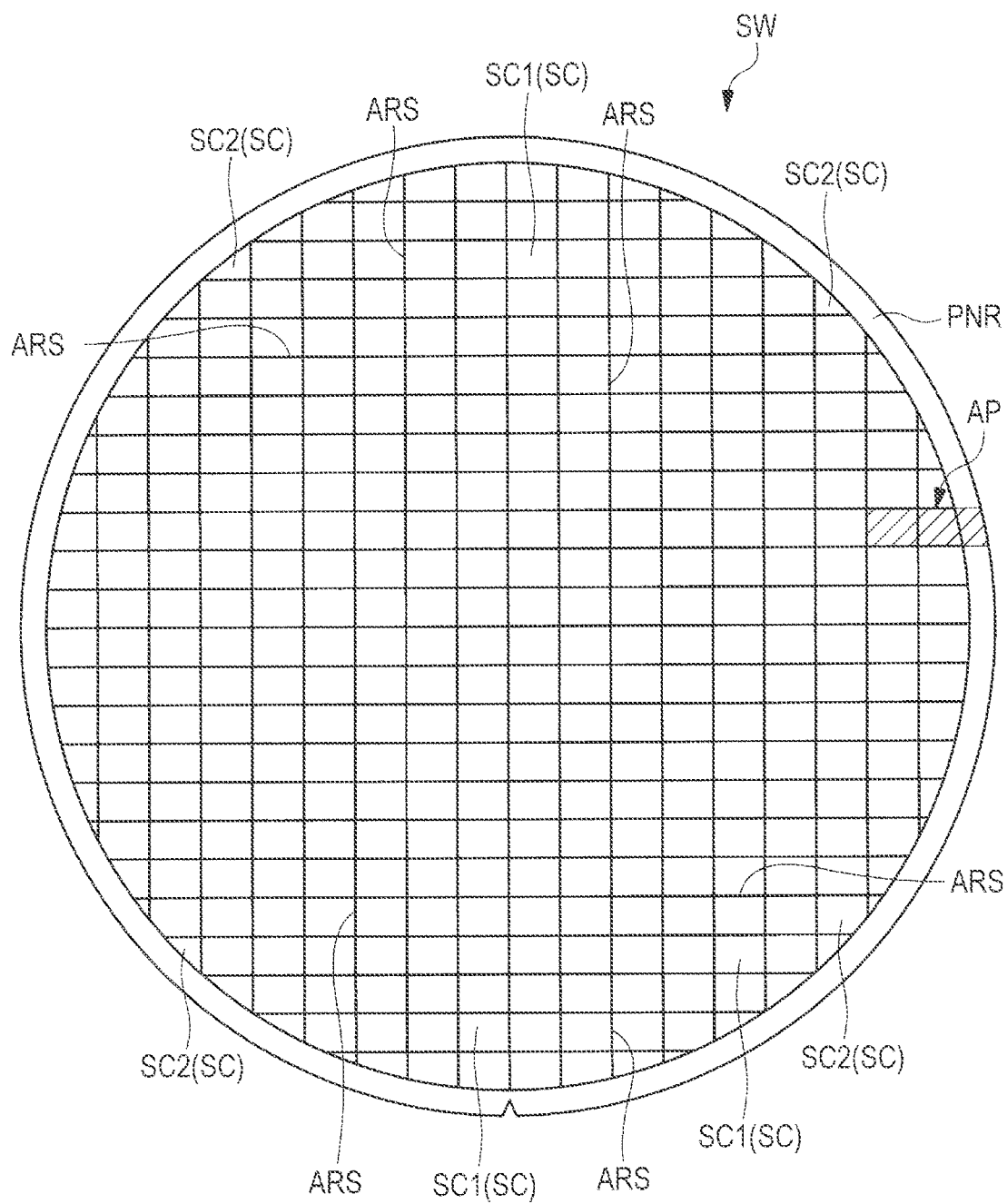
FIG. 2 is a plan view showing a top surface of a semiconductor wafer with a plurality of semiconductor devices (semiconductor chips) formed there according to the embodiment.

FIG. 2 is a plan view showing the state of the top surface of the semiconductor wafer with a plurality of semiconductor devices (semiconductor chips) formed there according to the embodiment.

As shown in FIG. 2, a plurality of semiconductor chips SC partitioned by a lattice-shaped scribe region (scribe line and spacing) ARS are formed on the surface (first main surface, top surface) of a semiconductor wafer SW. The width of the scribe region ARS is, for example, about 90 μm to 110 μm. A pattern prohibiting region PNR without any pattern of a conductive film (hereinafter, referred to as a conductive pattern) and of an insulating film covering the conductive pattern (hereinafter, referred to as an insulating pattern) is provided around the outer peripheral portion of the semiconductor wafer SW.

In the process of grinding a rear surface (second main surface, bottom surface) of the semiconductor wafer SW (TAIKO grinding process P02) described later, a surface protective tape is attached to the top surface of the semiconductor wafer SW. The scribe region ARS is formed also in the outer peripheral portion of the semiconductor wafer SW; therefore, there is a fear that the water supplied for grinding the rear surface of the semiconductor wafer SW may intrude to the top surface of the semiconductor wafer SW through the scribe region ARS. In order to avoid intrusion of the grinding water, the pattern prohibiting region PNR without the conductive pattern and the insulating pattern is provided around the peripheral portion of the semiconductor wafer SW, hence to make the surface protective tape difficult to peel off.

Almost all the pattern prohibiting region PNR is an area removed after grinding the rear surface of the semiconductor wafer SW in the TAIKO process. The above conductive pattern includes an emitter electrode EE, a gate electrode GE, a gate wiring GL, a field plate FPE, and a guard ring electrode GRE (refer to FIGS. 3 and 4) in the IE type trench gate IGBT described later and, for example, it is made of a metal film mainly including aluminum. The above insulating pattern is a protective film RF (refer to FIG. 4) in the IE type trench gate IGBT described later and, for example, it is made of an organic resin film mainly including polyimide.

The semiconductor chip SC has a product chip SC1 where a semiconductor integrated circuit device is formed and an imperfect pseudo chip SC2 that cannot be a product chip SC1. Plural pseudo chips SC2 (dummy region, outer peripheral excessive region) are arranged outside of the plural product chips SC1 (device region) arranged in a matrix shape to surround the plural product chips SC1 and the pattern prohibiting region PNR is arranged outside of the plural pseudo chips SC2 to surround the plural pseudo chips SC2.

Figure 3:
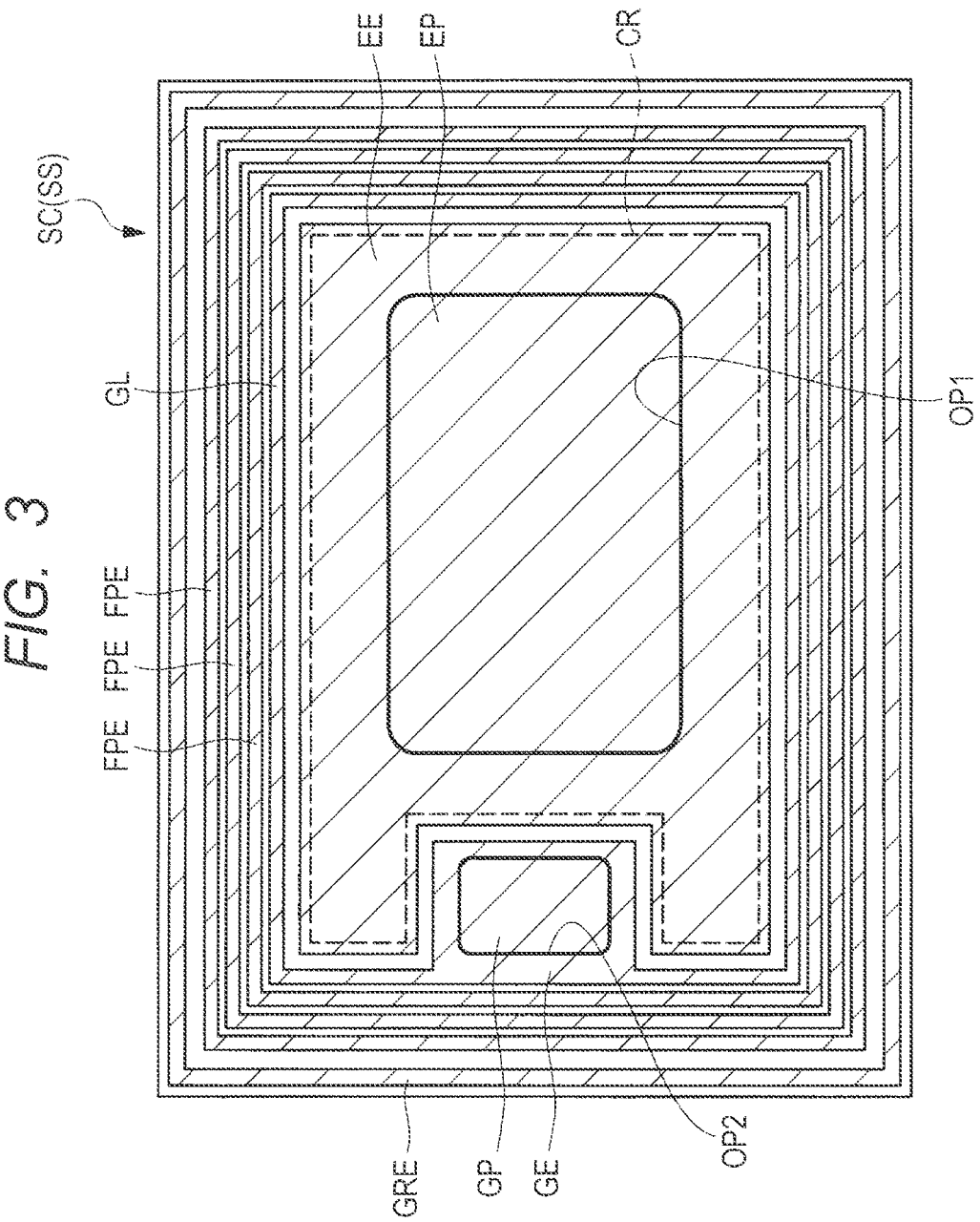
FIG. 3 is a plan view showing a semiconductor device (semiconductor chip) according to the embodiment.

FIG. 3 is a plan view showing a semiconductor device (semiconductor chip) according to the embodiment. In FIG. 3, the protective film RF (refer to FIG. 4) is shown transparent to easily understand the structure.

As shown in FIG. 3, the semiconductor chip SC includes a semiconductor substrate SS and the semiconductor substrate SS has a top surface Sa (refer to FIG. 4) as one main surface and a bottom surface Sb (refer to FIG. 4) opposite to the top surface Sa as the other main surface.

The top surface of the semiconductor chip SC in the outer peripheral portion is provided with a ring shaped guard ring electrode GRE and a single or a plurality of ring shaped field plates FPE inside the above electrode. The guard ring electrode GRE and the field plate FPE are made of, for example, a metal film mainly including aluminum. FIG. 3 shows three ring shaped field plates FPE by way of example; however, it is not restricted to this number.

A cell forming region CR is provided in a main portion of an active part of the semiconductor chip SC inside the ring shaped field plate FPE. The cell forming region CR is provided with the emitter electrode EE. The center portion of the emitter electrode EE becomes an emitter pad EP for coupling a bonding wire. The emitter pad EP is formed by baring the emitter electrode EE from an opening portion OP1 formed in the protective film RF (refer to FIG. 4) which covers the emitter electrode EE. The emitter electrode EE is made of, for example, a metal film mainly including aluminum.

A gate wiring GL and a gate electrode GE are provided between the cell forming region CR and the ring shaped field plate FPE. The gate wiring GL is coupled to the gate electrode GE and they are provided outward from the emitter electrode EE, for example, in the outer periphery of the semiconductor chip SC. The center portion of the gate electrode GE is a gate pad GP for coupling a bonding wire. The gate pad GP is formed by baring the gate electrode GE from an opening portion OP2 formed in the protective film RF (refer to FIG. 4) which covers the gate electrode GE. The gate wiring GL and the gate electrode GE are made of, for example, a metal film mainly including aluminum.

Figure 4:
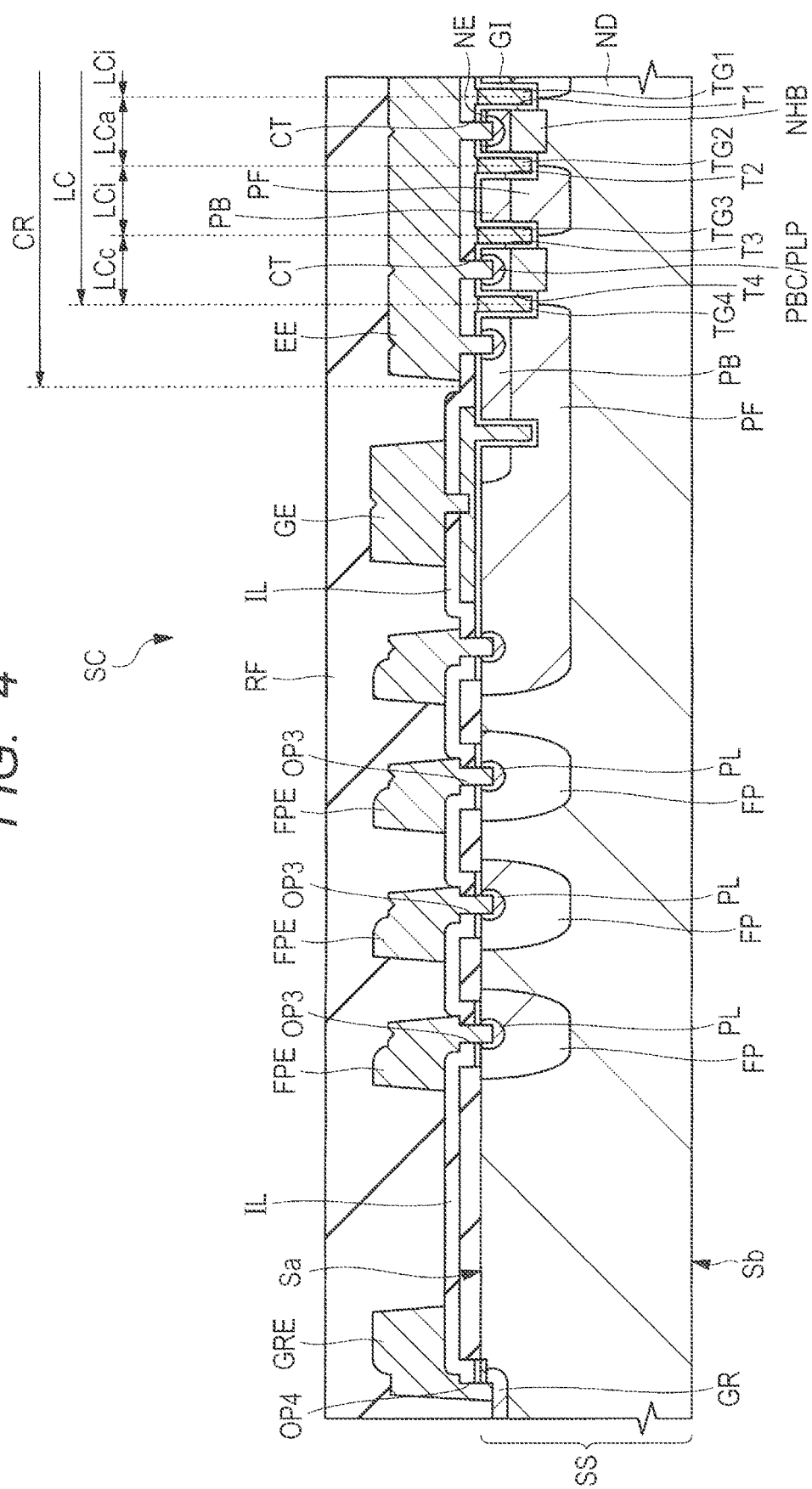
FIG. 4 is a cross-sectional view showing a part of the semiconductor device according to the embodiment.

FIG. 4 is a cross-sectional view showing a part of a semiconductor device according to the embodiment.

At first, the active part of the semiconductor chip SC will be described.

The IE type trench gate IGBT including a linear active cell region LCa and a linear hole collector cell region LCc and a linear inactive cell region LCi therebetween is formed in the cell forming region CR of the semiconductor device according to the embodiment. The linear active cell region LCa or the linear hole collector cell region LCc and the linear inactive cell region LCi are alternately arranged, to form a linear unit cell region LC, and the IE type trench gate IGBT according to the embodiment is a so-called "alternate arrangement system". Here, the structure of the IE type trench gate IGBT is disclosed in, for example, Japanese Unexamined Patent Application Publication No. 2013-140885 and the description of the detailed structure and effects is omitted.

As shown in FIG. 4, the main portion of the semiconductor substrate SS is occupied by an $n^-$-type drift region ND. A p-type body region PB is provided on the whole surface (the whole cell forming region CR) of the semiconductor substrate SS on the side of the top surface Sa. The thickness of the semiconductor substrate SS is, for example, about 450 μm to 1,000 μm and the typical thickness is about 550 μm.

A first trench T1 and a second trench T2 are provided in the boundary of the linear active cell region LCa and the linear inactive cell region LCi on the side of the top surface Sa of the semiconductor substrate SS, and within each trench, a first linear trench gate electrode TG1 and a second linear trench gate electrode TG2 are provided through the gate insulating film GI. The first linear trench gate electrode TG1 and the second linear trench gate electrode TG2 are electrically coupled to the gate electrode GE.

Further, a third trench T3 and a fourth trench T4 are provided in the boundary of the linear hole collector cell region LCc and the linear inactive cell region LCi on the side of the top surface Sa of the semiconductor substrate SS, and within each trench, a third linear trench gate electrode TG3 and a fourth linear trench gate electrode TG4 are provided through the gate insulating film GI. The third linear trench gate electrode TG3 and the fourth linear trench gate electrode TG4 are electrically coupled to the emitter electrode EE. In FIG. 4, one linear inactive cell region LCi in the boundary where the fourth trench T4 is formed is omitted.

The gate insulating film GI is made of, for example, silicon oxide and the thickness thereof is, for example, about 0.1 μm to 0.2 μm.

An interlayer insulating film IL is formed on the whole surface of the semiconductor substrate SS on the side of the top surface Sa. The interlayer insulating film IL is made of, for example, a Phosphosilicate Glass (PSG) film, a Borophosphosilicate Glass (BPSG) film, a Non-doped Silicate Glass (NSG) film, a Spin-On-Glass (SOG) film or these combined film and its thickness is, for example, about 0.6 μm.

A contact groove CT penetrating the interlayer insulating film IL and arriving at the p-type body region PB is formed in the center portion between the first trench T1 and the second trench T2 on the side of the top surface Sa of the semiconductor substrate SS in the linear active cell region LCa.

A contact groove CT penetrating the interlayer insulating film IL and arriving at the p-type body region PB is formed in the center portion between the third trench T3 and the fourth trench T4 on the side of the top surface Sa of the semiconductor substrate SS in the linear hole collector cell region LCc.

An $n^+$-type emitter region NE is provided in the linear active cell region LCa on the side of the top surface Sa of the semiconductor substrate SS, and a $p^+$-type body contact region PBC and a $p^+$-type latch-up prevention region PLP to surround the $p^+$-type body contact region PBC are provided within the p-type body region PB in the lower end of the contact groove CT. Further, an n-type hole barrier region NHB is provided under the p-type body region PB. The doping structure of the dopant in the linear hole collector cell region LCc is almost identical to that in the linear active cell region LCa, except that the $n^+$-type emitter region NE is not provided.

In the linear inactive cell region LCi, a p-type floating region PF deeper than, for example, the first trench T1, the second trench T2, the third trench T3, and the fourth trench T4 is provided under the p-type body region PB on the side of the top surface Sa of the semiconductor substrate SS.

In the embodiment, the $p^+$-type body contact region PBC, the $p^+$-type latch-up prevention region PLP, and the n-type hole barrier region NHB are provided also in the linear hole collector cell region CLc, similarly to the linear active cell region LCa; however, these are not indispensable. By providing these, it is possible to keep balance in the hole flow on the whole.

The emitter electrode EE is provided on the interlayer insulating film IL and coupled to the $n^+$-type emitter region NE and the $p^+$-type body contact region PBC through the contact groove CT. Although it is not illustrated, the emitter electrode EE is electrically coupled to the third linear trench gate electrode TG3 and the fourth linear trench gate electrode TG4. Further, the gate electrode GE and the gate wiring GL (refer to FIG. 3) are provided on the interlayer insulating film IL, and the gate electrode GE is electrically coupled to the first linear trench gate electrode TG1 and the second linear trench gate electrode TG2 although it is not illustrated. The emitter electrode EE, the gate electrode GE, and the gate wiring GL (refer to FIG. 3) are made of, for example, a metal film mainly including aluminum and their thickness is, for example, about 3.5 µm.

The protective film RF is formed to cover the emitter electrode EE, the gate electrode GE, and the gate wiring GL (refer to FIG. 3). The protective film RF is made of, for example, an organic resin film mainly including polyimide and its thickness is, for example, 10 µm. The organic resin film mainly including polyimide is formed, for example, through application and may be either photosensitive or non-photosensitive. The protective film RF is the upmost layer of the film deposited on the side of the top surface of the semiconductor wafer SW and works to protect the IE type trench IGBT and the respective electrodes (emitter electrode EE, gate electrode GE, and gate wiring GL (refer to FIG. 3)).

Next, the outer peripheral portion of the semiconductor chip will be described.

A single or a plurality of ring shaped p-type field limiting rings FP (Field Limiting Rings) are formed in the outer peripheral portion of the semiconductor chip SC to surround the active part and further, a ring shaped p-type guard ring (channel stopper) GR is formed to surround the ring shaped p-type field limiting ring or rings FP.

The p-type field limiting ring FP is formed within the $n^-$-type drift region ND, in the same process as that of the p-type floating region PF in the active part. The interlayer insulating film IL is formed also in the outer peripheral portion of the semiconductor chip SC and the ring shaped field plate FPE is electrically coupled to the ring shaped p-type field limiting ring FP through the opening portion OP3 formed in the interlayer insulating film IL. A pt-type region PL is formed in the p-type field limiting ring FP at the lower end of the opening portion OP3 and the pt-type region PL is formed, for example, in the same process as that of the pt-type latch-up prevention region PLP in the active part.

The voltage of the p-type field limiting ring FP is fixed by the field plate FPE. FIG. 4 shows an example with three p-type field limiting rings FP formed; however, it is not restricted to this number. By forming a plurality of p-type field limiting rings FP, an electric field is shared among the plural p-type field limiting rings FP, which can make the breakdown voltage higher in the IE type trench gate IGBT according to the embodiment.

The p-type guard ring GR is formed within the $n^-$-type drift region ND and works to protect the IE type trench gate IGBT after the semiconductor wafer SW is divided into the individual semiconductor chips SC. The ring shaped guard ring electrode GRE is electrically coupled to the ring shaped p-type guard ring GR through the opening portion OP4 formed in the interlayer insulating film IL. The voltage of the p-type guard ring GR is fixed by the guard ring electrode GRE.

The field plate FPE and the guard ring electrode GRE are made of, for example, a metal film mainly including aluminum and their thickness is, for example, about 3.5 µm.

Similarly to the active part, the protective film RF is formed to cover the field plate FPE and the p-type guard ring GR. This protective film RF is the upmost film deposited on the top surface of the semiconductor wafer SW, working to protect the respective electrodes (the field plate FPE and the guard ring electrode GRE).

Figure 5A:
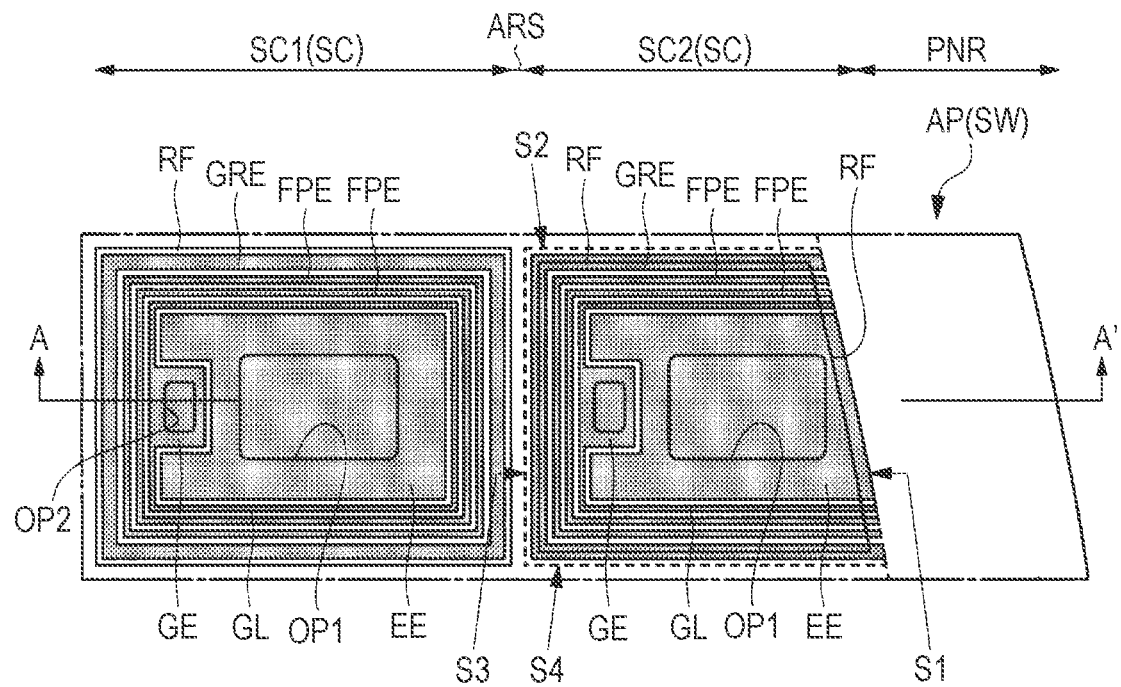
FIG. 5A (a) is a plan view showing an AP region shown in FIG. 2 in an enlarged way and FIG. 5A (b) is a schematic view showing the cross-section taken along the line A-A' in FIG. 5A (a).
Figure 5A:
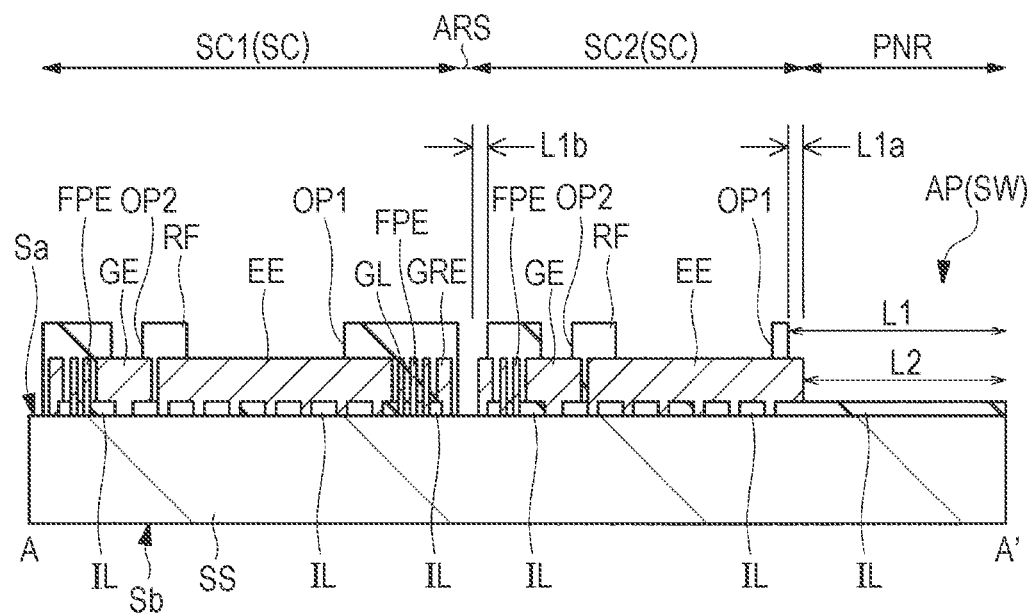

FIG. 5A (a) is a plan view showing the AP region shown in FIG. 2 in an enlarged way. FIG. 5A (b) is a schematic view showing the cross-section taken along the line A-A' of FIG. 5A (a).

As shown in FIGS. 5A (a) and (b), the semiconductor wafer SW has the semiconductor substrate SS and the semiconductor substrate SS has a top surface Sa as one main surface and a bottom surface Sb opposite to the top surface Sa as the other main surface.

Of the plural semiconductor chips SC arranged in a matrix shape, each product chip SC1 has, for example, the IE type trench gate IGBT in the active part and the plural p-type field limiting rings and the p-type guard ring in the outer peripheral portion (refer to FIG. 4) on the side of the top surface Sa of the semiconductor substrate SS, and these are covered with the interlayer insulating film IL.

In the active part of the semiconductor chip SC, the emitter electrode EE formed on the interlayer insulating film IL on the side of the top surface Sa of the semiconductor substrate SS is electrically coupled to the $n^+$-type emitter region, the third linear trench gate electrode, and the fourth linear trench gate electrode forming the IE type trench gate IGBT (refer to FIG. 4). The emitter electrode EE applies an emitter voltage to the $n^+$-type emitter region, the third linear trench gate electrode, and the fourth linear trench gate electrode. The gate electrode GE formed on the interlayer insulating film IL on the side of the top surface Sa of the semiconductor substrate SS is electrically coupled to the first linear trench gate electrode and the second linear trench gate electrode forming the IE type trench gate IGBT through the gate wiring GL (refer to FIG. 4). The gate electrode GE applies a voltage to the first linear trench gate electrode and the second linear trench gate electrode. As mentioned above, the emitter electrode EE, the gate electrode GE, and the gate wiring GL are made of, for example, a metal film mainly including aluminum.

In the outer peripheral portion of the semiconductor ship SC, the field plate FPE formed on the interlayer insulating film IL on the side of the top surface Sa of the semiconductor substrate SS is electrically coupled to the p-type field limiting ring (refer to FIG. 4), and the field plate FPE applies a voltage to the p-type field limiting ring. The guard ring electrode GRE formed on the interlayer insulating film IL on the side of the top surface Sa of the semiconductor substrate SS is electrically coupled to the p-type guard ring (refer to FIG. 4), and the guard ring electrode GRE applies a voltage to the p-type guard ring. As mentioned above, the field plate FPE and the guard ring electrode GRE are made of, for example, a metal film mainly including aluminum.

Further, in the active part and the outer peripheral portion of the semiconductor chip SC, the protective film RF is formed for every semiconductor chip SC to cover the emitter electrode EE, the gate electrode GE, the gate wiring GL, the field plate FPE, and the guard ring electrode GRE. As mentioned above, the protective film RF is made of, for example, an organic insulating film mainly including polyimide.

On the other hand, in the pattern prohibiting region PNR of the semiconductor wafer SW, the interlayer insulating film IL is formed on the top surface Sa of the semiconductor substrate SS; however, the emitter electrode EE, the gate electrode GE, the gate wiring GL, the field plate FPE, and the guard ring electrode GRE are not formed there and the protective film RF to cover these electrodes is not formed either. In FIG. 5A (b), only the interlayer insulating film IL is formed on the top surface Sa of the semiconductor substrate SS in the pattern prohibiting region PNR but there is a case where, for example, the insulating film of a different layer from the interlayer insulating film IL is formed under the interlayer insulating film IL.

The layout of the protective film RF is different between the product chip SC1 and the pseudo chip SC2 which is positioned between the product chip SC1 and the pattern prohibiting region PNR.

As for the product chip SC1, the protective film RF covers the whole top surface Sa of the semiconductor substrate SS including the outer periphery of the product chip SC1. In other words, the emitter electrode EE, the gate electrode GE, the gate wiring GL, the field plate FPE, and the guard ring electrode GRE formed on the top surface Sa of the semiconductor substrate SS are covered with the protective film RF, except for the opening portion OP1 baring the emitter pad of the emitter electrode EE and the opening portion OP2 baring the gate pad of the gate electrode GE.

On the contrary, as for the pseudo chip SC2, the protective film RF does not cover the whole top surface Sa of the semiconductor substrate SS including the outer periphery of the pseudo chip SC2. In other words, in addition to the opening portion OP1 baring the emitter pad of the emitter electrode EE and the opening portion OP2 baring the gate pad of the gate electrode GE, each part of the emitter electrode EE, the gate electrode GE, the gate wiring GL, the field plate FPE, and the guard ring electrode GRE positioned in the outer peripheral portion of the pseudo chip SC2 is not covered with the protective film RF but bared.

In other words, in the case of the pseudo chip SC2 shown in FIGS. 5A (a) and (b), with respect to the side S1 adjacent to the pattern prohibiting region PNR (the boundary between the pattern prohibiting region PNR and the pseudo chip SC2), the end surface of the protective film RF is inwardly positioned by a distance L1a from the side S1 (the pattern prohibiting region PNR) in an opposite direction to the side S1. Further, with respect to the other sides S2, S3, and S4 not adjacent to the pattern prohibiting region PNR, the end surface of the protective film RF is inwardly positioned by a distance L1b from the outer periphery of the pseudo chip SC2 in an opposite direction to the sides S2, S3, and S4. Here, the distance L1a may be identical to the distance L1b. The distance L1b may be different among the sides S2, S3, and S4.

Specifically, in the case of the pseudo chip SC2 shown in FIGS. 5A (a) and (b), with respect to the side S1 adjacent to the pattern prohibiting region PNR, the emitter electrode EE, the gate wiring GL, the field plate FPE, and the guard ring electrode GRE are formed to the side S1 of the pseudo chip SC2. The end surface of the protective film RF (the end surface facing the pattern prohibiting region PNR), however, is positioned on the respective electrodes of the emitter electrode EE, the gate wiring GL, the field plate FPE, and the guard ring electrode GRE, as for the side S1, and the ends of the respective electrodes on the side of the pattern prohibiting region PNR are bared from the protective film RF.

In the case of the pseudo chip SC2 shown in FIGS. 5A (a) and (b), with respect to the sides S2, S3, and S4 not adjacent to the pattern prohibiting region PNR, the guard ring electrode GRE is formed along the sides S2, S3, and S4 of the pseudo chip SC2. The end surface of the protective film RF, however, as for the sides S2, S3, and S4 not adjacent to the pattern prohibiting region PNR, is positioned on the guard ring electrode GRE and a part of the guard ring electrode GRE is bared from the protective film RF.

Accordingly, a distance L1 from the outer periphery of the semiconductor wafer SW to the end surface of the protective film RF formed in the pseudo chip SC2 facing the pattern prohibiting region PNR is larger than a distance L2 from the outer periphery of the semiconductor wafer SW to the end surface of each electrode famed in the pseudo chip SC2 facing the pattern prohibiting region PNR. A difference between the distance L1 and the distance L2 is, for example, 0.4 mm and more; for example, the distance L1 may be defined as 4.0 mm and the distance L2 may be defined as 3.6 mm.

Figure 5B:
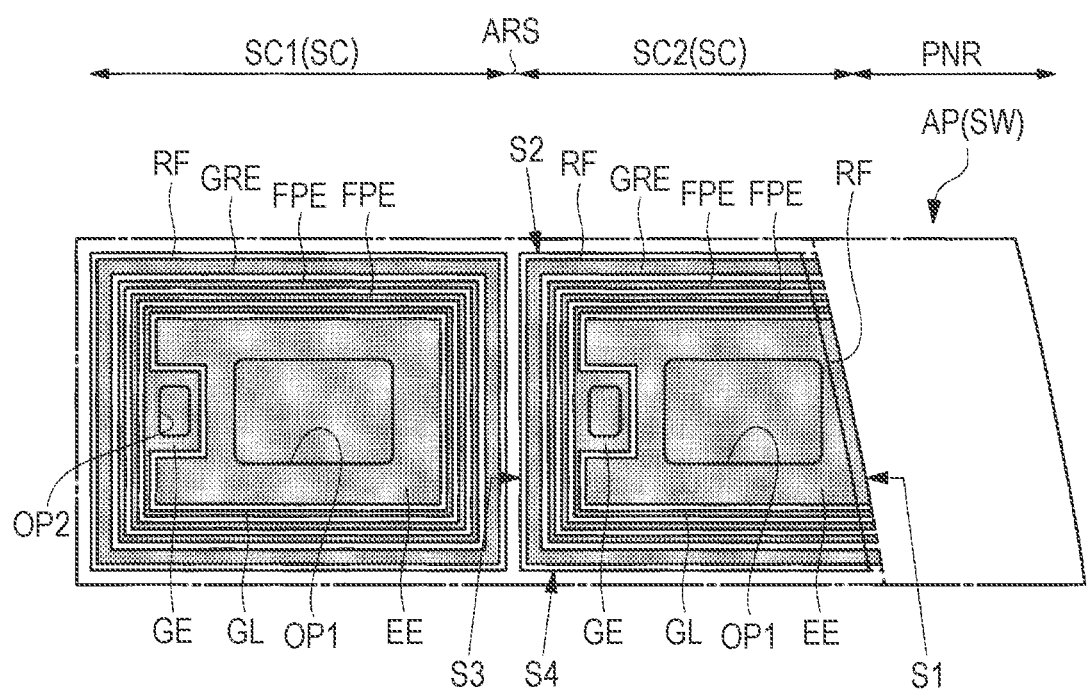
FIG. 5B is a plan view showing another example of the AP region shown in FIG. 2 in an enlarged way.

FIG. 5B shows another layout of the protective film formed on the pseudo chip SC2. FIG. 5B is a plan view of another example of the AP area shown in an enlarged way in FIG. 2.

In the case of the pseudo chip SC2 shown in FIG. 5B, with respect to the side S1 adjacent to the pattern prohibiting region PNR, the emitter electrode EE, the gate wiring GL, the field plate FPE, and the guard ring electrode GRE are formed to the side S1 of the pseudo chip SC2. Similarly to FIGS. 5A (a) and (b), as for the side S1 adjacent to the pattern prohibiting region PNR, the end surface of the protective film RF (the end surface facing the pattern prohibiting region PNR) is positioned on the respective electrodes of the emitter electrode EE, the gate wiring GL, the field plate FPE, and the guard ring electrode GRE, and the end portions of the respective electrodes on the side of the pattern prohibiting region PNR are bared from the protective film RF.

On the other hand, with respect to the sides S2, S3, and S4 not adjacent to the pattern prohibiting region PNR, the guard ring electrode GRE is formed along the sides S2, S3, and S4 of the pseudo chip SC2, the protective film RF is formed to cover the guard ring electrode GRE, and the guard ring electrode GRE is not bared from the protective film RF.

As mentioned above, of the outer peripheral portion of the pseudo chip SC2, with respect to only the side S1 adjacent to the pattern prohibiting region PNR1, the end surface of the protective film RF (the end surface facing the pattern prohibiting region PNR) is positioned on the respective electrodes so that the end surfaces of the respective electrodes may be bared from the protective film RF on the side of the pattern prohibiting region PNR.

In FIGS. 5A (a) and (b) and FIG. 5B, although the emitter electrode EE, the gate wiring GL, the field plate FPE, and the guard ring electrode GRE are electrodes adjacent to the pattern prohibiting region PNR, the electrode adjacent to the pattern prohibiting region PNR is not restricted to these but it may be various depending on the position of the pseudo chip SC2 in the semiconductor wafer SW.

The layout of the protective film RF provided in the pseudo chip SC2 will be described in detail in <Problem in Ring Cutting of Semiconductor Wafer in Comparison Example> and <Structure, Characteristic, and Effect of Semiconductor Wafer according to the Embodiment> described later.

<Process P02-Process P04: Back Grinding of Semiconductor Wafer>

Figure 6:
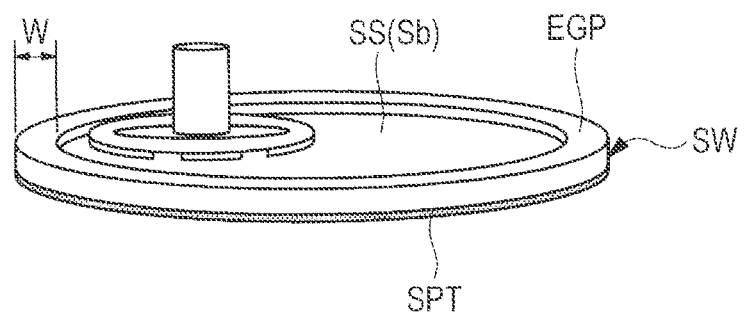
FIG. 6 is a perspective view for use in describing the TAIKO grinding (back grinding of semiconductor wafer) process according to the embodiment.
Figure 7:
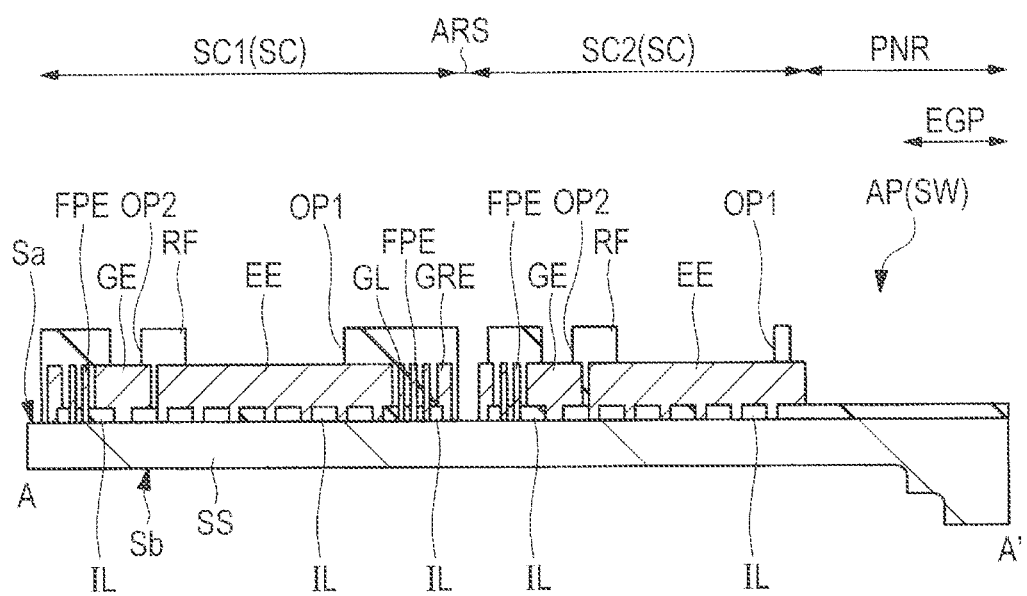
FIG. 7 is a schematic view showing the cross-section taken along the line A-A' of FIG. 5A (a) after the TAIKO grinding according to the embodiment.
Figure 8:
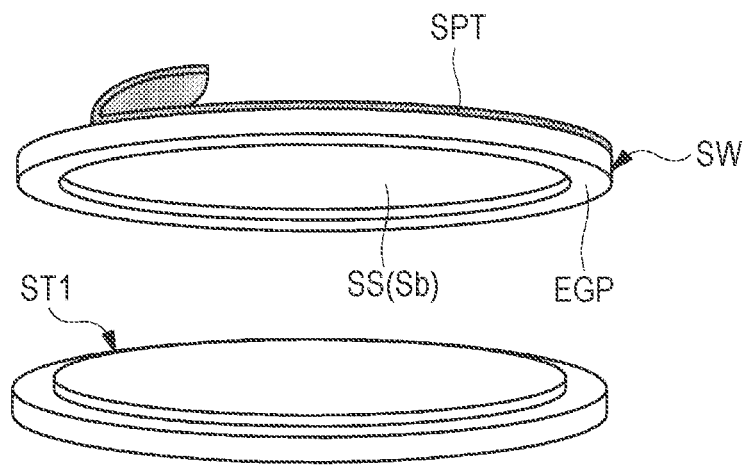
FIG. 8 is a perspective view for use in describing the tape removing process according to the embodiment.
Figure 9:
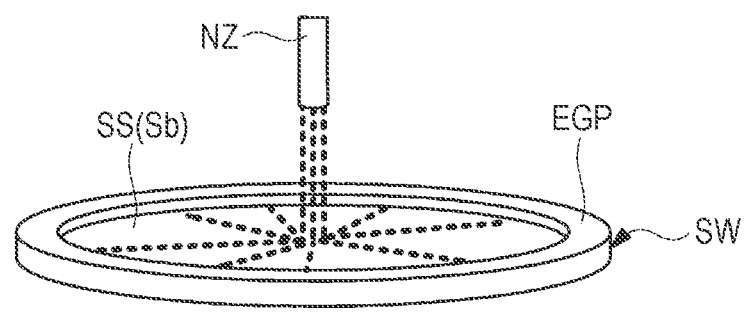
FIG. 9 is a perspective view for use in describing the spin etching process according to the embodiment.

The back grinding process of the semiconductor wafer will be described using FIGS. 6 to 9. FIG. 6 is a perspective view for use in describing the TAIKO grinding (semiconductor wafer back grinding) process according to the embodiment. FIG. 7 is a schematic view showing a cross-section taken along the line A-A' of FIG. 5A (a) after the TAIKO grinding according to the embodiment. FIG. 8 is a perspective view for use in describing the tape peeling off process according to the embodiment. FIG. 9 is a perspective view for use in describing the spin etching process according to the embodiment.

As shown in FIG. 6, the surface protective tape SPT is attached to the surface of the semiconductor wafer SW. As the surface protective tape SPT, a high rigidity tape made of, for example, polyethylene terephthalate (PET) can be used. The thickness of the surface protective tape SPT is, for example, about 100 μm to 200 μm.

Next, the top surface Sa (refer to FIG. 4) protected by the surface protective tape SPT is put downward and the semiconductor substrate SS is ground from the bottom surface Sb to thin the semiconductor substrate SS, for example, to about 60 μm (here, an example of a breakdown voltage of about 600 V is shown) (Process P02). Since the surface protective tape SPT is attached to the top surface of the semiconductor wafer SW, the IE type trench gate IGBT and the respective electrodes are never broken. The thickness of the semiconductor substrate SS depends on the required breakdown voltage. Accordingly, the thickness of the semiconductor substrate SS is, for example, about 120 μm with the breakdown voltage 1,200 V and, for example, about 40 μm with the breakdown voltage 400 V.

The TAIKO process is used for the above grinding of the semiconductor substrate SS. Specifically, as shown in FIG. 7, the edge portion EGP (reinforcing portion, ring shaped reinforcing portion, ring shaped convex for reinforcement) in the outermost periphery of the semiconductor wafer SW is left and only the inner bottom surface Sb of the semiconductor substrate SS is ground to be thinned. The width of the edge portion EGP not ground is, for example, about 2.5 mm to 3 mm.

Next, as shown in FIG. 8, the surface protective tape SPT is peeled off from the semiconductor wafer SW (Process P03). The top surface of the surface protective tape SPT has foreign substance, for example, silicon waste generated when grinding the bottom surface Sb of the semiconductor substrate SS; however, when the surface protective tape SPT is peeled off, the foreign substance is removed at the same time, hence to prevent the foreign substance from entering into the later process.

The semiconductor wafer SW is fixed to the stage ST1, for example, having a convex portion in its center portion and further a rotation mechanism, and then, by raising the temperature of the stage ST1, the thermally forming surface protective tape SPT peels off by itself. Alternatively, the surface protective tape SPT may be peeled off by irradiating the same tape with ultraviolet ray.

As shown in FIG. 9, the bottom surface Sb of the semiconductor substrate SS is rinsed (spin etched) using etching liquid including hydrofluoric acid, and the warp and foreign substance on the bottom surface Sb of the semiconductor substrate SS generated at the grinding is removed (Process P04).

For example, after the semiconductor wafer SW is fixed to a spin head including a rotation mechanism in a vacuum sucking way or mechanically, while rotating the semiconductor wafer SW, the bottom surface Sb of the semiconductor substrate SS is rinsed by running the etching liquid to the bottom surface Sb of the semiconductor substrate SS from a nozzle NZ provided above the semiconductor wafer SW.

<Process P05-Process P07: Fainting Back Surface Electrode of Semiconductor Device>

Figure 10:
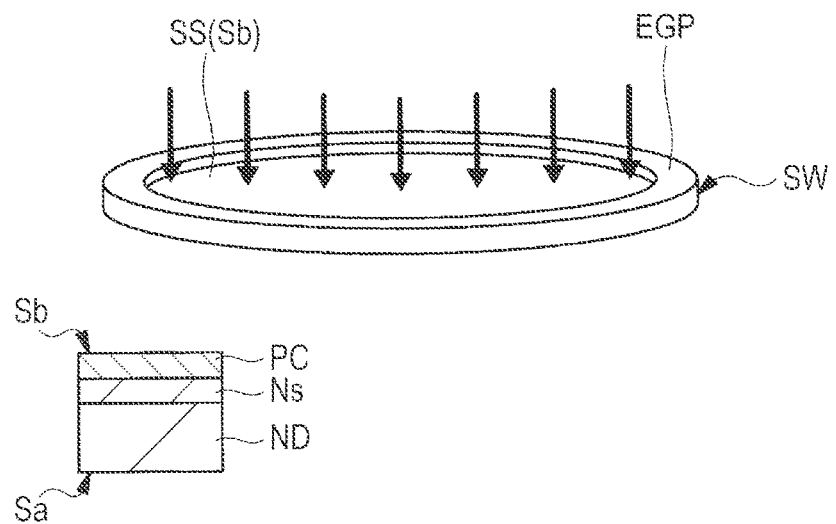
FIG. 10 is a perspective view for use in describing the wafer back surface ion implantation process according to the embodiment.
Figure 11:
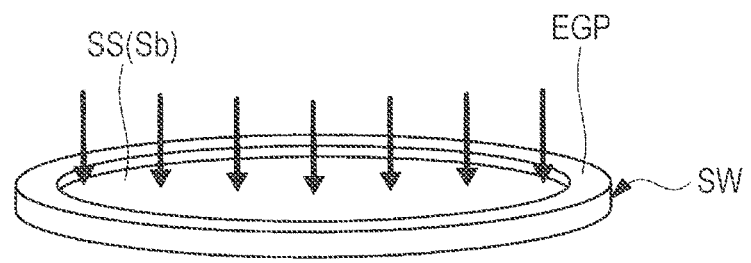
FIG. 11 is a perspective view for use in describing the laser processing process according to the embodiment.
Figure 12:
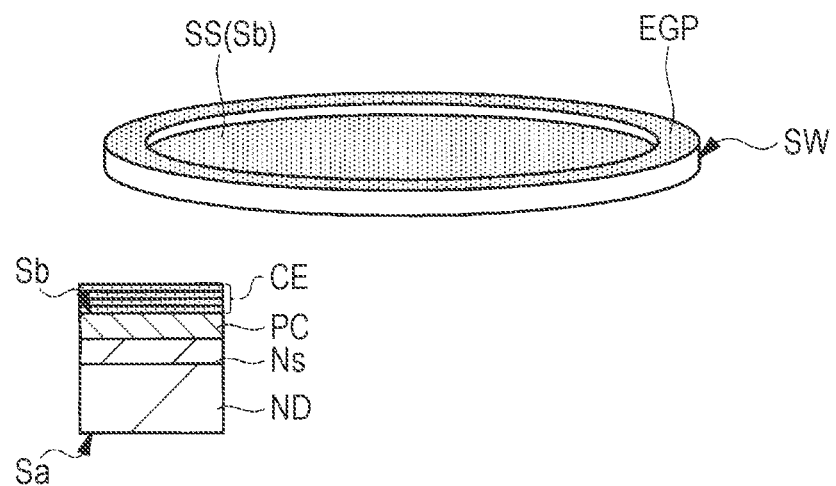
FIG. 12 is a perspective view for use in describing the wafer back electrode forming process according to the embodiment.

The forming process of back surface electrode of a semiconductor device will be described using FIGS. 10 to 12. FIG. 10 is a perspective view for use in describing the wafer back surface ion implantation process according to the embodiment. FIG. 11 is a perspective view for use in describing the laser processing process according to the embodiment. FIG. 12 is a perspective view for use in describing the wafer back electrode forming process according to the embodiment.

As shown in FIG. 10, dopant having n-type conductivity (for example, phosphorus) is ion-implanted to the bottom surface Sb of the semiconductor substrate SS, to form an n-type field stop region Ns with a first depth from the bottom surface of the semiconductor substrate SS. The energy in the phosphorus ion implantation is, for example, about 350 KeV and the dose amount is, for example, $7 \times 10^{12}$ cm$^{-2}$. Then, dopant having p-type conductivity (for example, boron) is ion-implanted to the bottom surface Sb of the semiconductor substrate SS, to form a p$^+$-type collector region PC with a second depth shallower than the first depth from the bottom surface Sb of the semiconductor substrate SS. The energy in the boron ion implantation is, for example, 40 KeV and the dose amount is, for example, $5 \times 10^{14}$ cm$^{-2}$. According to this, the n-type field stop region Ns and the pt-type collector region PC are formed on the side of the bottom surface Sb of the semiconductor substrate SS from the nearer side of the n$^-$-type drift region ND (Process P05).

As shown in FIG. 11, the semiconductor substrate SS is irradiated with a laser beam from the side of the bottom surface Sb of the semiconductor substrate SS, to activate the dopant ion implanted in the semiconductor substrate SS (Process P06).

As shown in FIG. 12, after the semiconductor substrate SS is rinsed with cleaning liquid including hydrofluoric acid, for example, a first nickel film, a titanium film, a second nickel film, and a gold film are sequentially formed as a conductive film on the bottom surface Sb of the semiconductor substrate SS according to the sputtering or vacuum vapor deposition, to form a film stack of these (Process P07). The thickness of the first nickel film is, for example, about 100 nm, the thickness of the titanium film is, for example, about 100 nm, the thickness of the second titanium film is, for example, about 600 nm, and the thickness of the gold film is, for example, about 100 nm. The film stack becomes a collector electrode CE electrically coupled to the pt-type collector region PC. Instead of the first nickel film and the titanium film, an aluminum film may be used.

<Process P08: Characteristic Test of Semiconductor Device>

Figure 13:
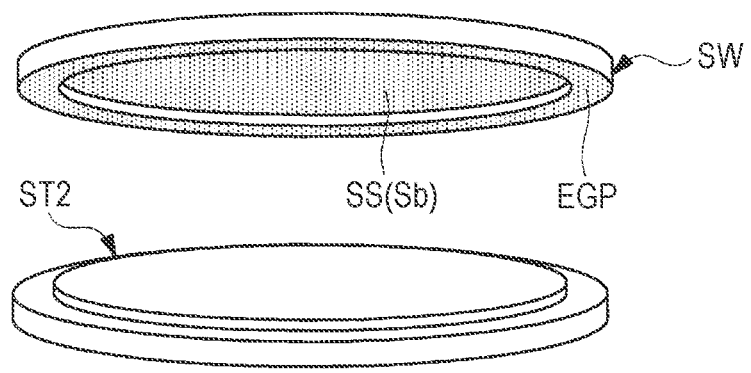
FIG. 13 is a perspective view for use in describing the characteristic test process according to the embodiment.

The characteristic test process of a semiconductor device formed on the semiconductor wafer will be described using FIG. 13. FIG. 13 is a perspective view for use in describing the characteristic test process of the semiconductor device according to the embodiment.

As shown in FIG. 13, for example, after the semiconductor wafer SW is fixed to the stage ST2 having a convex portion in its center portion, the characteristic test is performed respectively on the plural semiconductor devices formed on the semiconductor wafer SW (Process P08).

<Process P09-Process P11: Ring Cutting and Tape Cutting>

Figure 14:
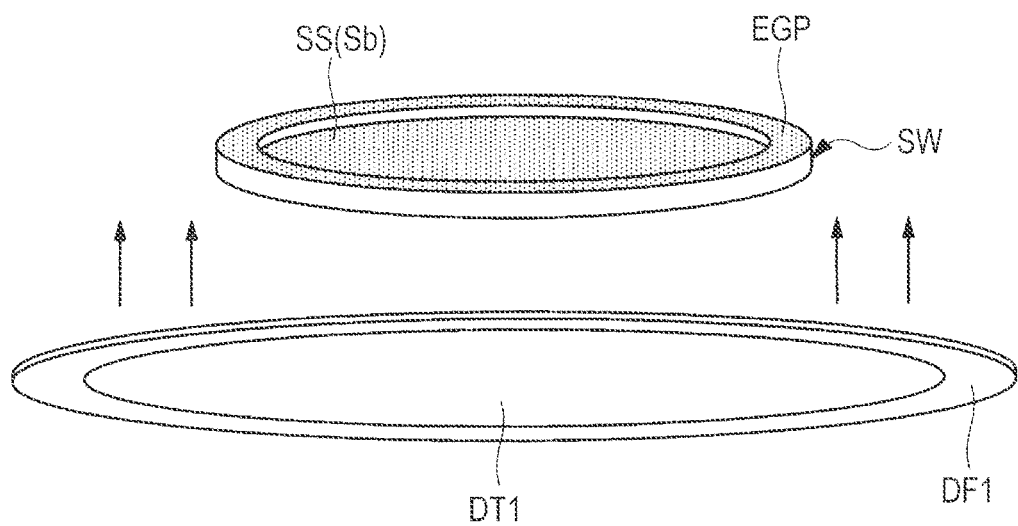
FIG. 14 is a perspective view for use in describing the tape attaching process according to the embodiment.
Figure 15:
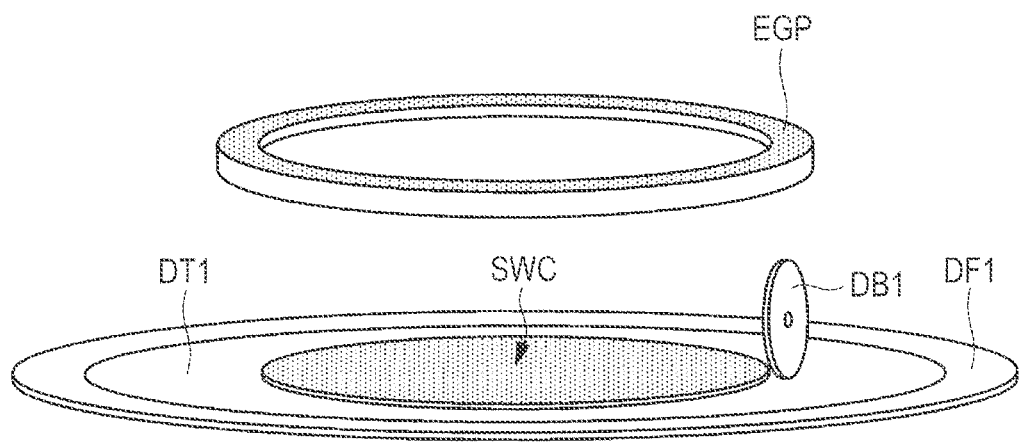
FIG. 15 is a perspective view for use in describing the ring cutting process according to the embodiment.
Figure 16:
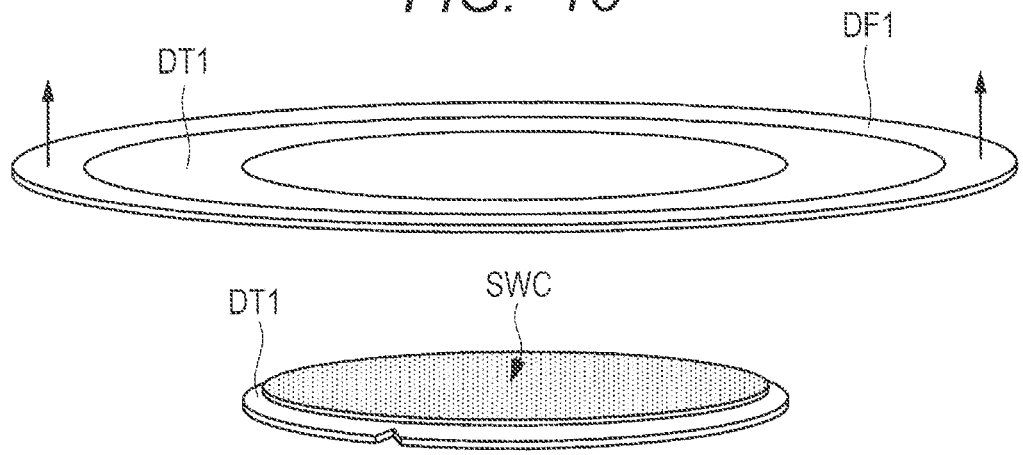
FIG. 16 is a perspective view for use in describing the tape cutting process according to the embodiment.
Figure 17:
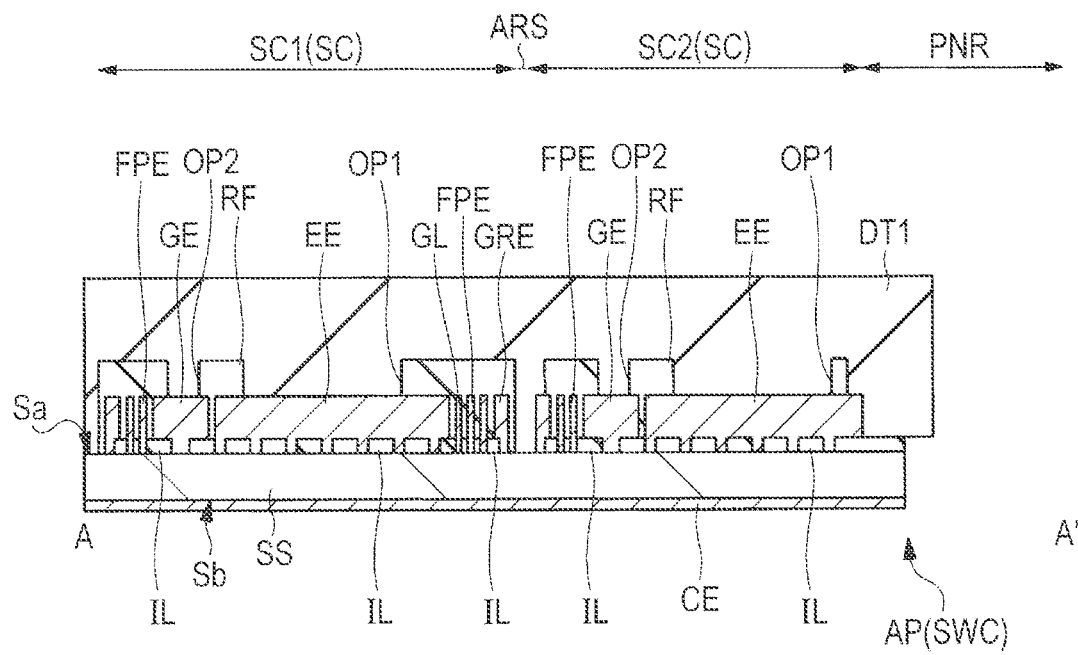
FIG. 17 is a schematic view showing the cross-section taken along the line A-A' in FIG. 5A (a) after the tape cutting according to the embodiment.

The ring cutting process and the tape cutting process of the semiconductor wafer will be described using FIGS. 14 to 17. FIG. 14 is a perspective view for use in describing the dicing tape attaching process according to the embodiment. FIG. 15 is a perspective view for use in describing the ring cutting process according to the embodiment. FIG. 16 is a perspective view for use in describing the tape cutting process according to the embodiment. FIG. 17 is a schematic view showing the cross-section taken along the line A-A' of FIG. 5A (a) after the tape cutting according to the embodiment.

As shown in FIG. 14, a ring shaped dicing frame DF1 with a dicing tape DT1 previously attached there is prepared, and the semiconductor wafer SW is attached to the top surface of the dicing tape DT1, so that the top surface Sa of the semiconductor substrate SS (refer to FIG. 4) may face the top surface of the dicing tape DT1 (Process P09).

Next, as shown in FIG. 15, for example, an ultrathin dicing blade (circular blade) DB1 with diamond fine particle attached is used to cut the ground and thinned region of the semiconductor substrate SS in a ring shape (ring cutting) along the boundary of the ground and thinned region of the semiconductor substrate SS and the edge portion EGP, thereby removing the edge portion EGP (Process P10). According to this, the semiconductor wafer SW as the thinned semiconductor substrate SS can be obtained. The thickness of the semiconductor substrate SS forming the semiconductor wafer SW is, for example, about 60 μm.

Next, as shown in FIG. 16, the dicing tape DT1 is cut along the outer periphery of the semiconductor wafer SW (tape cutting). In the ring cutting, a notch of the semiconductor wafer SW is removed, and therefore, in the tape cutting, a notch is formed in the dicing tape DT1 (Process P11). According to this, as shown in FIG. 17, with the dicing tape DT1 attached there, the semiconductor wafer SW as the thinned semiconductor substrate SS can be obtained.

<Process P12: Packaging of Semiconductor Wafer>

Figure 18:
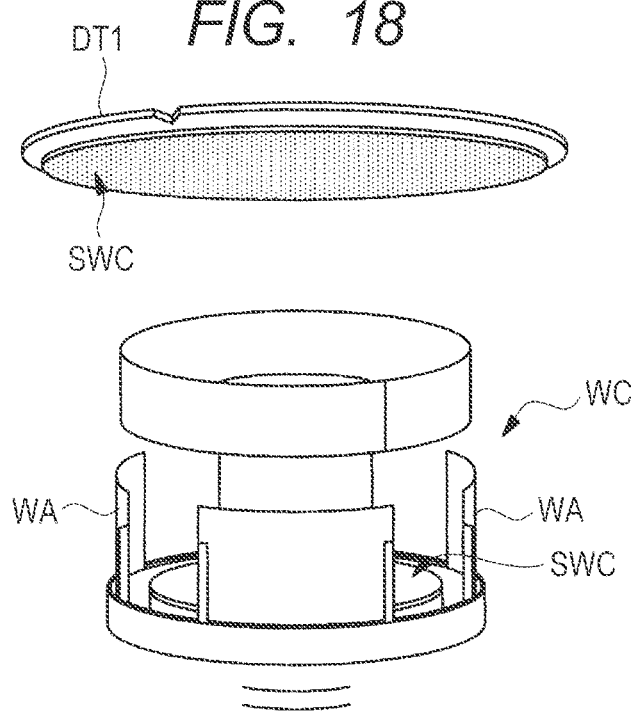
FIG. 18 is a perspective view for use in describing the packaging process according to the embodiment.

The packaging process of the semiconductor wafer will be described using FIG. 18. FIG. 18 is a perspective view for use of describing the packaging process according to the embodiment.

As shown in FIG. 18, a plurality of semiconductor wafers SW are packaged in a wafer carrying case WC (Process P12). The plural semiconductor wafers SW are fixed by a wall WA provided around the wafer carrying case WC. The thickness of the semiconductor substrate SS forming the semiconductor wafer SW is, for example, about 60 μm thin; however, since the dicing tape DT1 is attached to the rear surface of the semiconductor wafer SW, it is possible to prevent the semiconductor wafers SW from being cracked and chipped during carrying the above.

<Process P13-Process P15: Dicing of Semiconductor Wafer>

Figure 19:
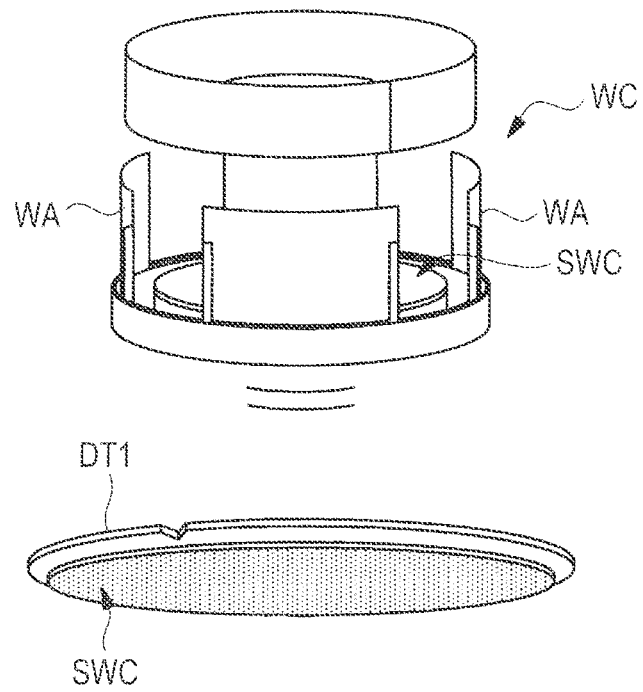
FIG. 19 is a perspective view for use in describing the post process accepting process according to the embodiment.
Figure 20:
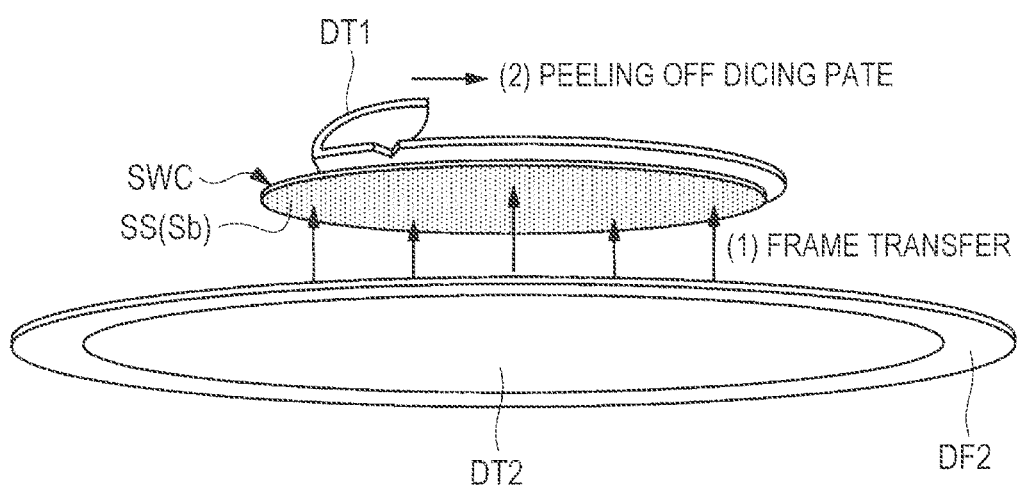
FIG. 20 is a perspective view for use in describing the tape attaching process according to the embodiment.
Figure 21:
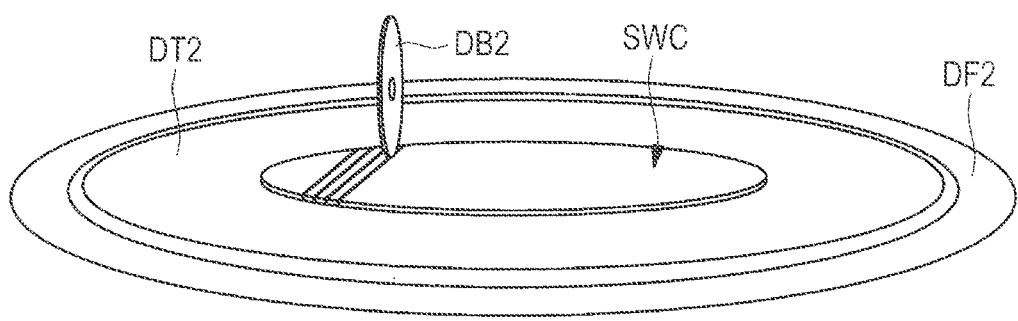
FIG. 21 is a perspective view for use in describing the dicing process according to the embodiment.

The carrying process and the dicing process of the semiconductor wafer will be described using FIGS. 19 to 21. FIG. 19 is a perspective view for use in describing the post process accepting process according to the embodiment. FIG. 20 is a perspective view for use in describing the tape attaching process according to the embodiment. FIG. 21 is a perspective view for use in describing the dicing process according to the embodiment.

As shown in FIG. 19, the plural semiconductor wafers SW are carried being accommodated in the wafer carrying case WC and accepted in the post process, and then, a necessary semiconductor wafer SW is taken out from the wafer carrying case WC (Process P13).

Next, as shown in FIG. 20, a ring shaped dicing frame DF2 with a dicing tape DT2 previously attached there is prepared, and the semiconductor wafer SW is adhered to the top surface of the dicing tape DT2 so that the bottom surface Sb of the semiconductor substrate SS may face the top surface of the dicing tape DT2 ((1) frame transfer). Continuously, the dicing tape DT1 attached to the top surface of the semiconductor wafer SW is peeled off ((2) dicing tape peeling off) (Process P14).

As shown in FIG. 21, the semiconductor wafer SW is cut vertically and horizontally along the scribe ARS (refer to FIG. 2), for example, using an ultrathin dicing blade (circular blade) DB2 with diamond fine particle attached (Process P15). The semiconductor wafer SW is divided into individual semiconductor chips, and after the individualization, the semiconductor chips are fixed to the dicing frame DF2 through the dicing tape DT2 and kept in order.

Next, ultraviolet ray is irradiated from the side of the bottom surface of the dicing tape DT2, to deteriorate the adhesive power of the adhesive layer of the dicing tape DT2; as the result, the semiconductor chips (semiconductor devices) become easy to peel off from the dicing tape DT2. Thereafter, the semiconductor chips (semiconductor devices) are assembled into individual semiconductor products.

Problem in Ring Cutting of Semiconductor Wafer According to Comparison Example

Figure 22:
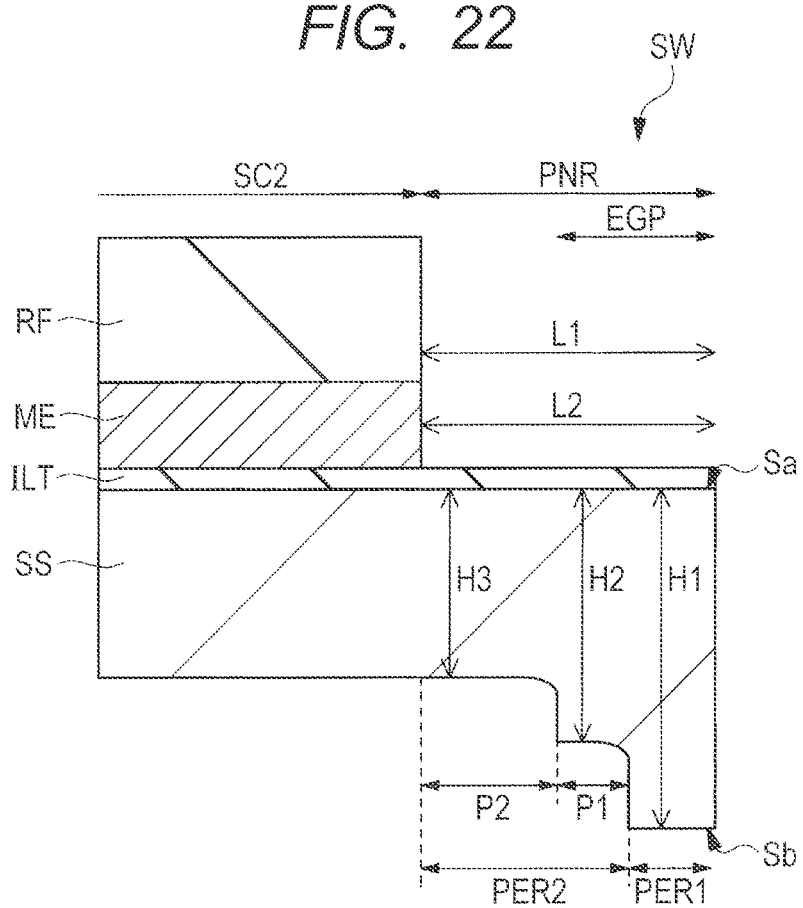
FIG. 22 is a cross-sectional view showing a pattern prohibiting region of a semiconductor wafer according to a comparison example 1 and a part of a pseudo chip adjacent to the pattern prohibiting region in an enlarged way, after the semiconductor wafer has been subjected to the TAIKO grinding.
Figure 23:
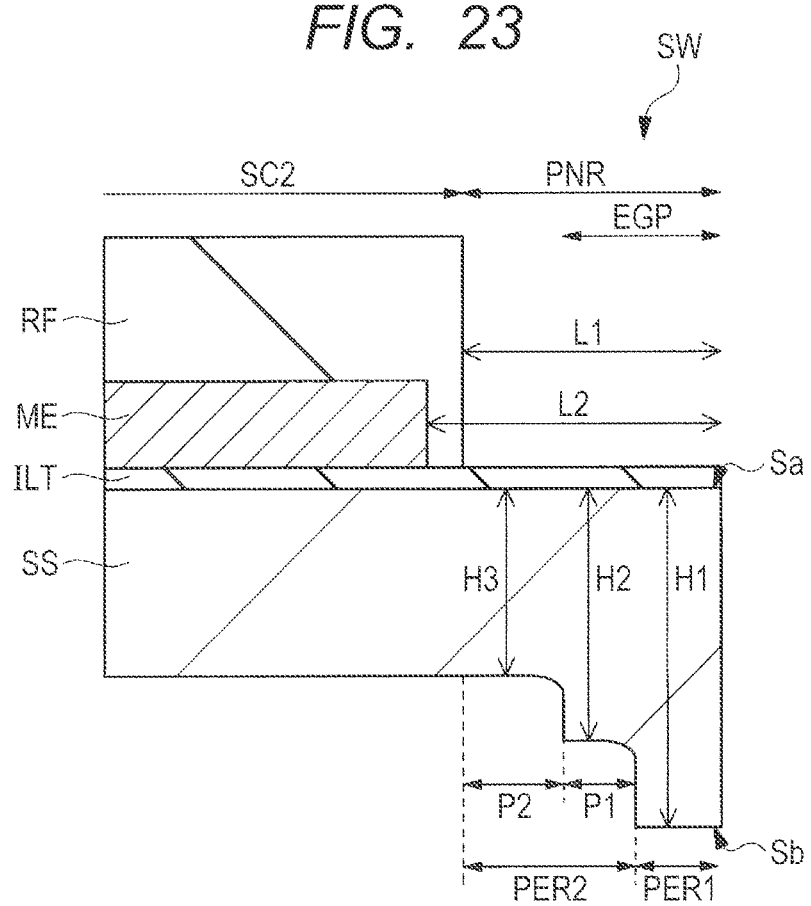
FIG. 23 is a cross-sectional view showing a pattern prohibiting region of a semiconductor wafer according to a comparison example 2 and a pseudo chip adjacent to the pattern prohibiting region in an enlarged way, after the semiconductor wafer has been subjected to the TAIKO grinding.
Figure 24:
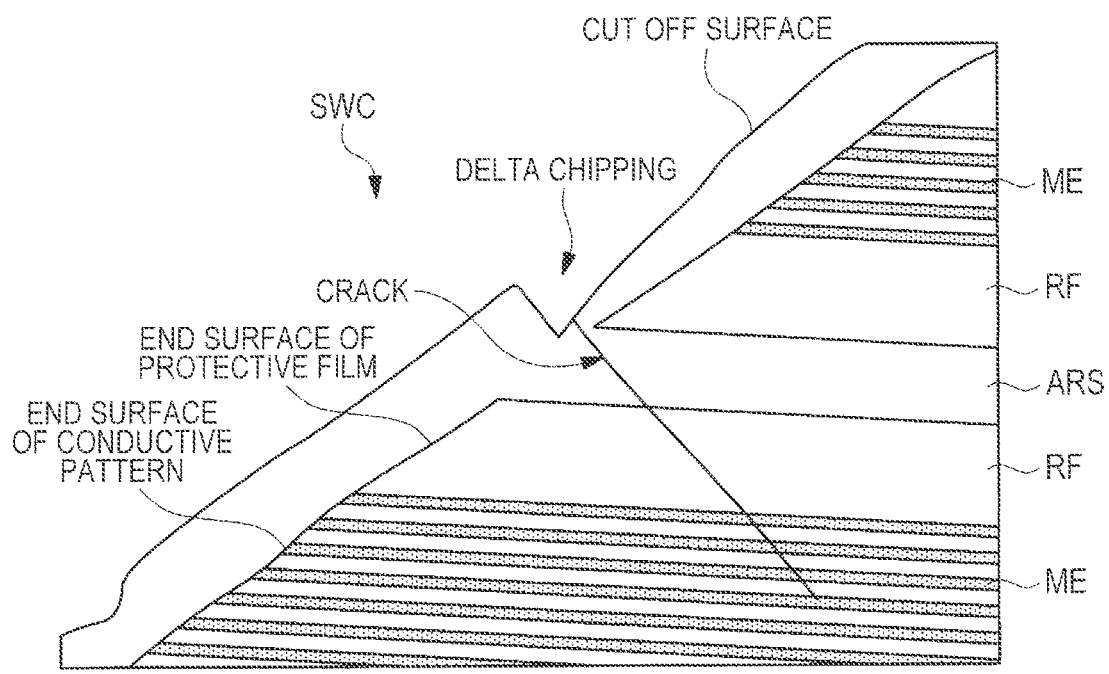
FIG. 24 is a plan view showing the state of the outer periphery of the semiconductor wafer after having been subjected to the ring cutting, according to the comparison examples 1 and 2.

Comparison examples 1 and 2 examined by the inventor et al. will be described using FIGS. 22 to 24 to make clearer the characteristic of the semiconductor wafer according to the embodiment. FIG. 22 is a cross-sectional view showing the pattern prohibiting region of the semiconductor wafer according to the comparison example 1 and a part of the pseudo wafer adjacent to this pattern prohibiting region in an enlarged way after the semiconductor wafer has been subjected to the TAIKO grinding. FIG. 23 is a cross-sectional view showing the pattern prohibiting region of the semiconductor wafer according to the comparison example 2 and a part of the pseudo wafer adjacent to this pattern prohibiting region in an enlarged way after the semiconductor wafer has been subjected to the TAIKO grinding. FIG. 24 is a plan view showing the state of the outer periphery of the semiconductor wafer after having been subjected to the ring cutting according to the comparison examples 1 and 2.

Structure of Semiconductor Wafer According to Comparison Example 1

As shown in FIG. 22, after the semiconductor wafer SW has been subjected to the TAIKO grinding according to the comparison example 1, the semiconductor wafer SW has a PER1 where the semiconductor substrate SS is not ground and a PER2 where the semiconductor substrate SS is ground, in the pattern prohibiting region PNR thereof. A first thickness H1 of the semiconductor substrate SS in the region PER1 where the semiconductor substrate SS is not ground is, for example, about 550 μm.

The semiconductor substrate SS in the region PER2 includes a first portion P1 having a second thickness H2 thinner than the first thickness H1 and a second portion P2 having a third thickness H3 thinner than the second thickness H2. The first portion P1 is positioned outside the semiconductor wafer SW, the second portion P2 is positioned inside the semiconductor wafer SW, and the third thickness H3 of the semiconductor substrate SS in the second portion P2 is, for example, about 60 μm and equal to the thickness of the semiconductor substrate SS forming the product chip.

In the comparison example 1, the protective film RF is formed on the conductive pattern ME on the side of the pattern prohibiting region PNR of the pseudo chip SC2 and the end surface of the conductive pattern ME on the same side overlaps with the end surface of the protective film RF on the same side in plan view.

In other words, the distance L1 from the outer periphery of the semiconductor wafer SW to the end surface of the protective film RF on the side of the pattern prohibiting region PNR of the pseudo chip SC2 is equal to the distance L2 from the outer periphery of the semiconductor wafer SW to the end surface of the conductive pattern ME on the same side. The distance L1 and the distance L2 are, for example, about 3.6 mm.

Here, the insulating film ILT means, for example, the interlayer insulating film IL in the above mentioned IE type trench gate IGBT or a film stack of the interlayer insulating film IL and the insulating film formed under the interlayer insulating film IL. The conductive pattern ME means, for example, the emitter electrode EE, the gate electrode GE, the gate wiring GL, the field plate FPE, and the guard ring electrode GRE in the above mentioned IE type trench gate IGBT. The conductive pattern ME is made of, for example, a metal film mainly including aluminum with the thickness of about 3.5 μm. The protective film RF is made of, for example, an organic resin film mainly including polyimide with the thickness of about 10 μm.

In the ring cutting, a dicing blade, for example, with the blade width of about 0.15 mm is used, to cut the semiconductor wafer SW at a position, for example, 3.05±0.25 mm from its outer periphery.

Structure of Semiconductor Wafer According to Comparison Example 2

As shown in FIG. 23, after the semiconductor wafer SW has been subjected to the TAIKO grinding according to the comparison example 2, similarly to the comparison example 1, the semiconductor wafer SW has the region PER1 where the semiconductor substrate SS is not ground and the region PER2 where the semiconductor substrate SS is ground, in the pattern prohibiting region PNR thereof. The first thickness H1 of the semiconductor substrate SS in the region PER1 where the semiconductor substrate SS is not ground is, for example, about 550 μm.

The semiconductor substrate SS in the region PER2 includes the first portion P1 having a second thickness H2 thinner than the first thickness H1 and a second portion P2 having a third thickness H3 thinner than the second thickness H2. The first portion P1 is positioned outside the semiconductor wafer SW, the second portion P2 is positioned inside the semiconductor wafer SW, and the third thickness H3 of the semiconductor substrate SS in the second portion P2 is, for example, about 60 μm and equal to the thickness of the semiconductor substrate SS forming the product chip.

In the comparison example 2, the protective film RF is formed on the conductive pattern ME on the side of the pattern prohibiting region PNR of the pseudo chip SC2 to cover the conductive pattern ME and the end surface of the conductive pattern ME on the same side is positioned on the inner top surface Sa of the semiconductor substrate SS than the end surface of the protective film RF on the same side.

The distance L1 from the outer periphery of the semiconductor wafer SW to the end surface of the protective film RF on the side of the pattern prohibiting region PNR of the pseudo chip SC2 is smaller than the distance L2 from the outer periphery of the semiconductor wafer SW to the end surface of the conductive pattern ME on the same side. The distance L1 is, for example, about 3.6 mm.

Here, the insulating film ILT means, for example, the interlayer insulating film IL in the above mentioned IE type trench gate IGBT or a film stack of the interlayer insulating film IL and the insulating film formed under the interlayer insulating film IL. The conductive pattern ME means, for example, the emitter electrode EE, the gate electrode GE, the gate wiring GL, the field plate FPE, and the guard ring electrode GRE in the above mentioned IE type trench gate IGBT. The conductive pattern ME is made of, for example, a metal film mainly including aluminum with the thickness of about 3.5 μm. The protective film RF is made of, for example, an organic resin film mainly including polyimide with the thickness of about 10 μm, for example.

In the ring cutting, a dicing blade, for example, with the blade width of about 0.15 mm is used, to cut the semiconductor wafer SW at the position, for example, 3.05±0.25 mm from the outer periphery thereof.

Problem of Comparison Example 1 and Comparison Example 2

After examination by the inventor et al., as shown in FIG. 24, both the comparison example 1 and the comparison example 2 have such a defect that triangular chippings occur in the outer periphery of the semiconductor wafer SW after the ring cutting, which trigger chipping or cracking of the semiconductor wafer SW.

Figure 25:
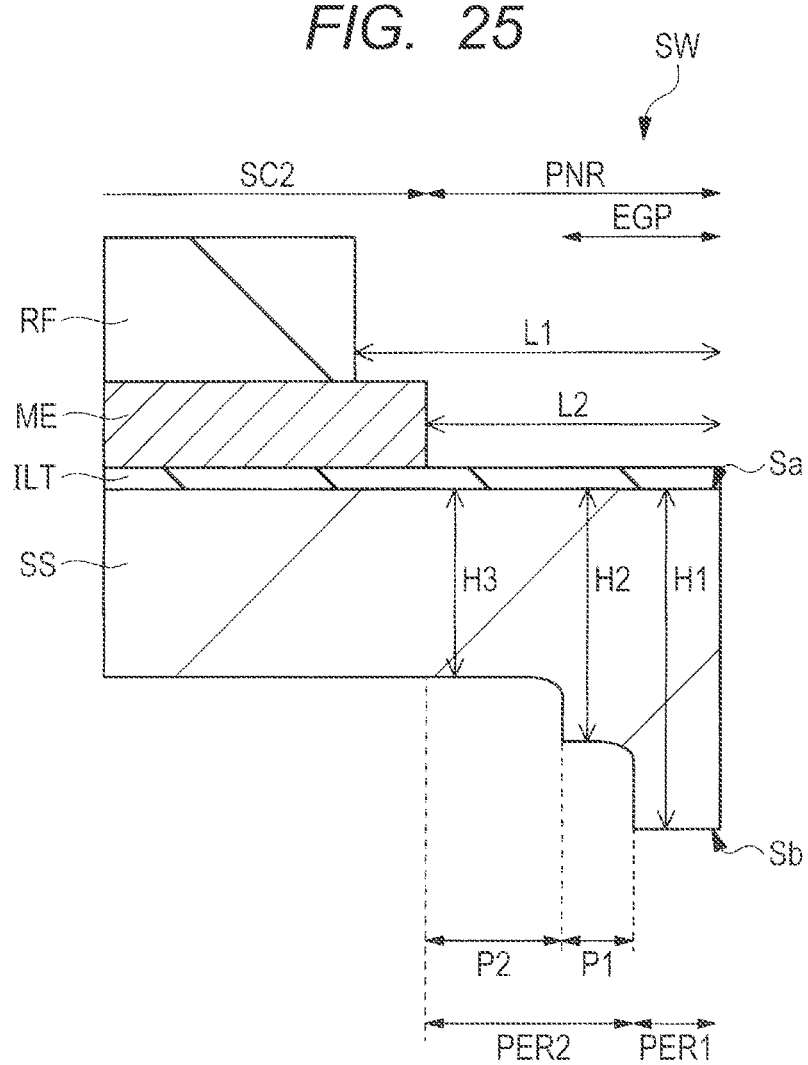
FIG. 25 is a cross-sectional view showing a pattern prohibiting region of a semiconductor wafer according to the embodiment and a pseudo chip adjacent to the pattern prohibiting region in an enlarged way, after the semiconductor wafer has been subjected to the TAIKO grinding.
Figure 26A:
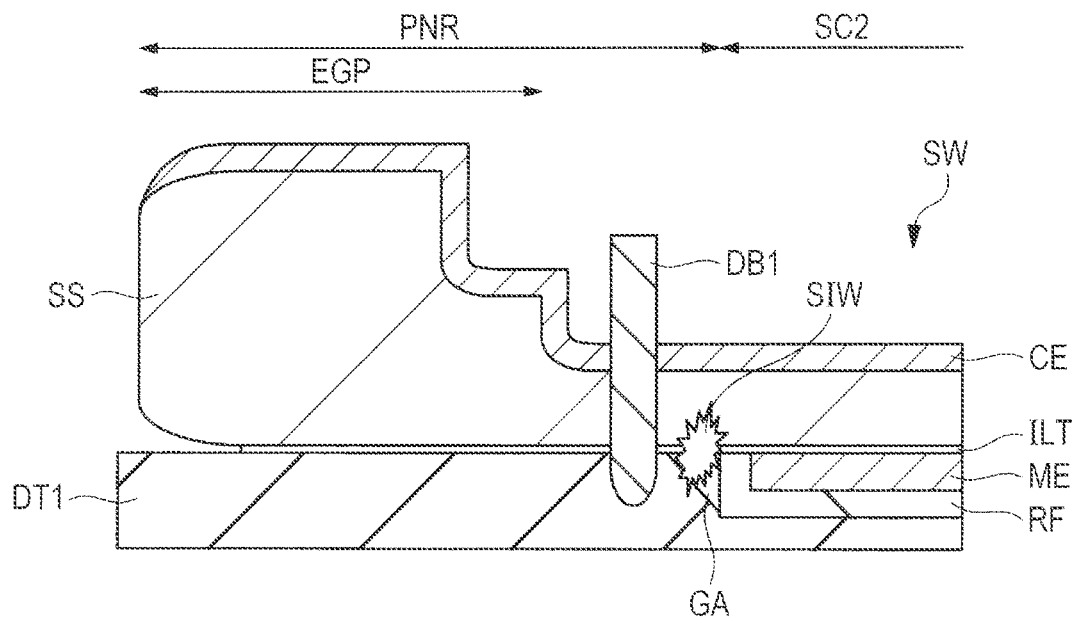
FIG. 26A is a cross-sectional view schematically showing the ring cutting state according to the comparison example 2 and FIG. 26B is a cross-sectional view schematically showing the ring cutting state according to the embodiment.
Figure 26B:
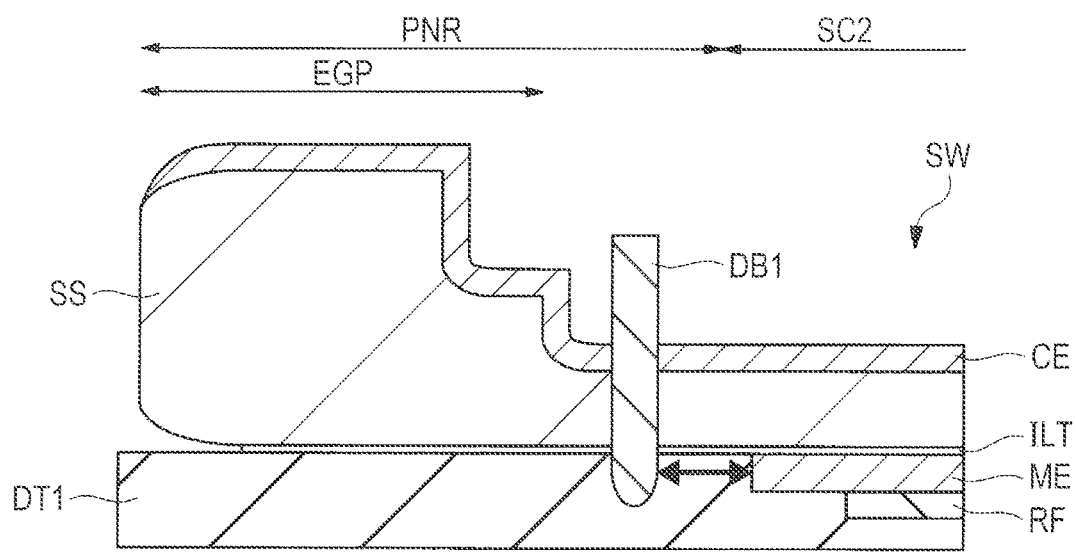
Figure 27:
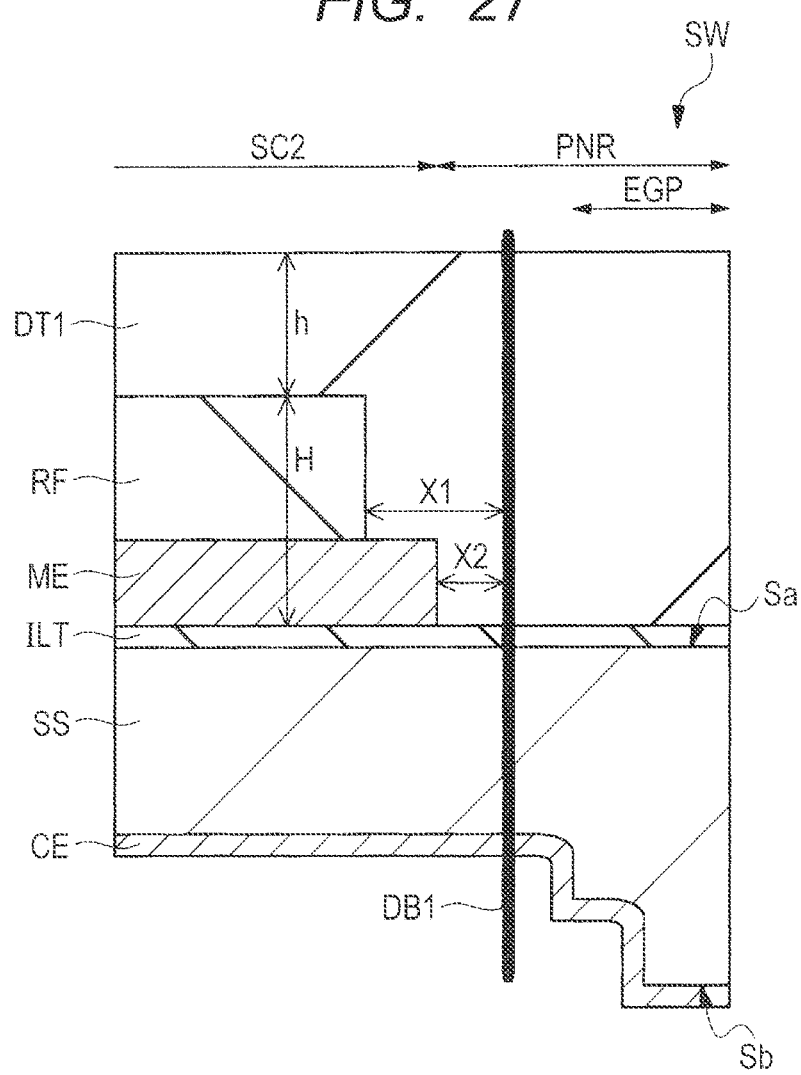
FIG. 27 is a cross-sectional view for use in describing the layout of a conductive pattern and an insulating pattern (protective film) formed on the pseudo chip adjacent to the pattern prohibiting region of the semiconductor wafer according to the embodiment.

Structure, Characteristic, and Effect of Semiconductor Wafer According to the Embodiment The structure, characteristic, and effect of the semiconductor wafer according to the embodiment will be described using FIGS. 25 to 27. FIG. 25 is a cross-sectional view showing the pattern prohibiting region of the semiconductor wafer according to the embodiment and a part of the pseudo chip adjacent to this prohibiting region in an enlarged way after the semiconductor wafer has been subjected to the TAIKO grinding. FIG. 26A is a cross-sectional view schematically showing the state of the ring cutting according to the comparison example 2. FIG. 26B is a cross-sectional view schematically showing the state of the ring cutting according to the embodiment. FIG. 27 is a cross-sectional view for use in describing the layout of the conductive pattern and the insulating pattern (protective film) formed on the pseudo chip adjacent to the pattern prohibiting region of the semiconductor wafer according to the embodiment.
<Structure and Characteristic of Semiconductor Wafer>

As shown in FIG. 25, after the TAIKO grinding of the semiconductor wafer SW according to the embodiment, the PER1 where the semiconductor substrate SS is not ground and the PER2 where the semiconductor substrate SS is ground are formed in the pattern prohibiting region PNR of the semiconductor wafer SW. The first thickness H1 of the semiconductor substrate SS in the region PER1 where the semiconductor substrate SS is not ground is, for example, about 550 μm.

The semiconductor substrate SS in the region PER2 includes the first portion P1 having the second thickness H2 thinner than the first thickness H1 and the second portion P2 having the third thickness H3 thinner than the second thickness H2. The first portion P1 is positioned outside the semiconductor wafer SW, the second portion P2 is positioned inside the semiconductor wafer SW, and the third thickness H3 of the semiconductor substrate SS in the second portion P2 is, for example, about 60 μm and equal to the thickness of the semiconductor substrate SS forming the product chip.

In the TAIKO grinding, generally rough cut grinding is performed and then finish grinding is performed; however, in order to strengthen the edge portion EGP of the semiconductor wafer SW, in the TAIKO process, there is a case of providing two steps intentionally in the pattern prohibiting region PNR of the semiconductor wafer SW. Specifically, the pattern prohibiting region PNR includes the second portion P2 of the semiconductor substrate SS with the third thickness H3, for example, about 60 μm and the first portion P1 of the semiconductor substrate SS with the second thickness H2 thicker than the third thickness H3, positioned in the further outer periphery of the semiconductor wafer SW than the second portion P2. The pattern prohibiting region PNR further includes the region PER1 which is formed by the semiconductor substrate SS with the first thickness H1, for example, about 550 μm thicker than the second thickness H2 and provided in the further outer periphery of the semiconductor wafer SW than the first portion P1. The first portion P1 and the region PER1 correspond to the edge portion EGP as the ring shaped reinforcing portion. The ring cutting region is positioned between the boundary of the pseudo chip SC2 and pattern prohibiting region PNR and the inner peripheral end of the edge portion EGP.

In the embodiment, the protective film RF is famed on the conductive pattern ME on the side of the pattern prohibiting region PNR of the pseudo chip SC2, and the end surface of the conductive pattern ME on the same side is positioned on the top surface Sa of the semiconductor substrate SS outer than the end surface of the protective film RF on the same side.

In other words, the distance L1 from the outer periphery of the semiconductor wafer SW to the end surface of the protective film RF on the side of the pattern prohibiting region PNR of the pseudo chip SC2 is larger than the distance L2 from the outer periphery of the semiconductor wafer SW to the end surface of the conductive pattern ME on the same side. A difference between the distance L1 and the distance L2 is preferably 0.4 mm and more, and by way of example, the distance L1 can be, for example, about 4.0 mm and the distance L2 can be, for example, about 3.6 mm.

Here, the insulating film ILT means, for example, the interlayer insulating film IL in the above mentioned IE type trench gate IGBT or a film stack of the interlayer insulating film IL and the insulating film formed under the interlayer insulating film IL. The conductive pattern ME means, for example, the emitter electrode EE, the gate electrode GE, the gate wiring GL, the field plate FPE, and the guard ring electrode GRE in the above mentioned IE type trench gate IGBT. The conductive pattern ME is made of, for example, a metal film mainly including aluminum with the thickness of about 3.5 μm. The protective film RF is made of, for example, an organic resin film mainly including polyimide with the thickness of about 10 μm.

In the ring cutting, a dicing blade, for example, with the blade width of about 0.15 mm is used, to cut the semiconductor wafer SW at the position, for example, 3.05±0.25 mm from the outer periphery thereof.
<Effect of Semiconductor Wafer>

After examination by the inventor et al., it is found that the embodiment has neither triangular chipping after the ring cutting that occurs in the outer periphery of the semiconductor wafer SW in the above mentioned comparison example 1 and comparison example 2 nor chipping or cracking of the semiconductor wafer SW triggered by the triangular chipping.

Hereinafter, using FIGS. 26A and B, a mechanism of generating the triangular chipping examined by the inventor et al. will be described. FIG. 26A is a cross-sectional view schematically showing the state of the ring cutting according to the comparison example 2 and FIG. 26B is a cross-sectional view schematically showing the state of the ring cutting according to the embodiment.

As shown in FIG. 26A, the protective film RF is formed to cover the conductive pattern ME in the comparison example 2 and the dicing tape DT1 is attached to the top surface of the semiconductor wafer SW. The ring cutting region is positioned between the boundary of the pseudo chip SC2 and pattern prohibiting region PNR and the inner peripheral end of the edge portion EGP. The thickness of the conductive pattern ME is, for example, about 3.5 μm, the thickness of the protective film RF is, for example, about 10 μm, and the thickness of the dicing tape DT1 is, for example, about 80 μm.

In the comparison example 2, a step caused by stacking the conductive pattern ME and the protective film RF (for example, about 13.5 μm) generates a gap GA between the dicing tape DT1 and the semiconductor substrate SS on the end surface of the protective film RF. During the ring cutting, silicon waste SIW generated by cutting the semiconductor substrate SS enters the gap GA and further may be wedged into the dicing blade DB1, to damage the dicing blade DB1; therefore, it is considered that crack is induced on the semiconductor wafer SW having been subjected to the ring cutting (refer to FIG. 24).

As shown in FIG. 26B, according to the embodiment, the end surface of the protective film RF on the side of the pattern prohibiting region PNR is positioned inner than the end surface of the conductive pattern ME on the same side, in the semiconductor wafer SW and the dicing tape DT1 is attached to the top surface of the semiconductor wafer SW. The ring cutting region is positioned between the boundary of the pseudo chip SC2 and pattern prohibiting region PNR and the inner peripheral end of the edge portion EGP. The thickness of the conductive pattern ME is, for example, about 3.5 μm, the thickness of the protective film RF is, for example, about 10 μm, and the thickness of the dicing tape DT1 is, for example, about 80 μm.

In the embodiment, there is a step (for example, about 3.5 μm) of the conductive pattern ME, its height is lower than the step of the comparison example 2 (for example, 13.5 μm), and therefore, the step of the conductive pattern ME hardly generates the gap GA between the dicing tape DT1 and the semiconductor substrate SS. According to this, during the ring cutting, the silicon waste SIW generated by cutting the semiconductor substrate SS is hardly wedged into the dicing blade DB1; therefore, it is possible to reduce the damage of the dicing blade DB1.

The distance between the ring cutting region and the pseudo chip SC2 (the end surface of the conductive pattern ME facing the pattern prohibiting region PNR) can be, for example, about 0.25 μm to 0.35 μm, and the position of the ring cutting region may be also defined by each thickness of the conductive pattern ME, the protective film RF, and the dicing tape DT1.

Each position of the end surface of the conductive pattern on the side of the pattern prohibiting region and the end surface of the protective film on the same side in the pseudo chip according to the embodiment will be described using FIG. 27. FIG. 27 is a cross-sectional view for use in describing the layout of the conductive pattern and the insulating pattern (protective film) formed in the pseudo chip adjacent to the pattern prohibiting region of the semiconductor wafer according to the embodiment.

According to the embodiment, the protective film RF is formed on the conductive pattern ME on the side of the pattern prohibiting region PNR in the pseudo chip SC2, and the end surface of the protective film RF on the side of the pattern prohibiting region PNR is inwardly positioned in the semiconductor wafer SW inner than the end surface of the conductive pattern ME on the same side.

As mentioned above (refer to FIG. 25), the distance L1 from the outer periphery of the semiconductor wafer SW to the end surface of the protective film RF on the side of the pattern prohibiting region PNR of the pseudo chip SC2 is larger than the distance L2 from the outer periphery of the semiconductor wafer SW to the end surface of the conductive pattern ME on the same side. Further, the ring cutting region is positioned between the boundary of the pseudo chip SC2 and pattern prohibiting region PNR and the inner peripheral end of the edge portion EGP. Accordingly, a distance X1 from the ring cutting region to the end surface of the protective film RF on the side of the pattern prohibiting region PNR is larger than a distance X2 from the ring cutting region to the end surface of the conductive pattern ME on the same side. Here, when the thickness of the film stack of the conductive pattern ME and the protective film RF is defined as H, each measurement (distance X1 and X2, and thickness H) is set to satisfy the relation of H<X2<(X1−X2). Further, when the thickness of the dicing tape DT1 on the protective film RF is defined as h, each measurement (distance X1 and X2 and thickness H and h) is set to satisfy the relation (H+h)<X2<(X1−X2). By setting each measurement, as mentioned above, no gap is generated between the end surfaces of the conductive pattern ME and the protective film RF and the dicing tape DT1, hence to avoid the damage of the dicing blade DB1.

As one example, the distance X1 from the ring cutting region to the end surface of the protective film RF on the side of the pattern prohibiting region PNR can be set at 0.65 μm, the distance X2 from the ring cutting region to the end surface of the conductive pattern ME on the side of the pattern prohibiting region PNR can be set at 0.25 μm, the thickness H of the film stack of the conductive pattern ME and the protective film RF can be set at 13.5 μm, and the thickness h of the dicing tape DT1 can be set at 80 μm.

As mentioned above, according to the embodiment, in the ring cutting of the semiconductor wafer SW in the TAIKO process, no triangular chipping occurs in the outer periphery of the semiconductor wafer SW having been subjected to the ring cutting; therefore, it is possible to avoid chipping or cracking triggered by the triangular chipping occurring in the ring-cut semiconductor wafer SW.

Modified Example

Figure 28:
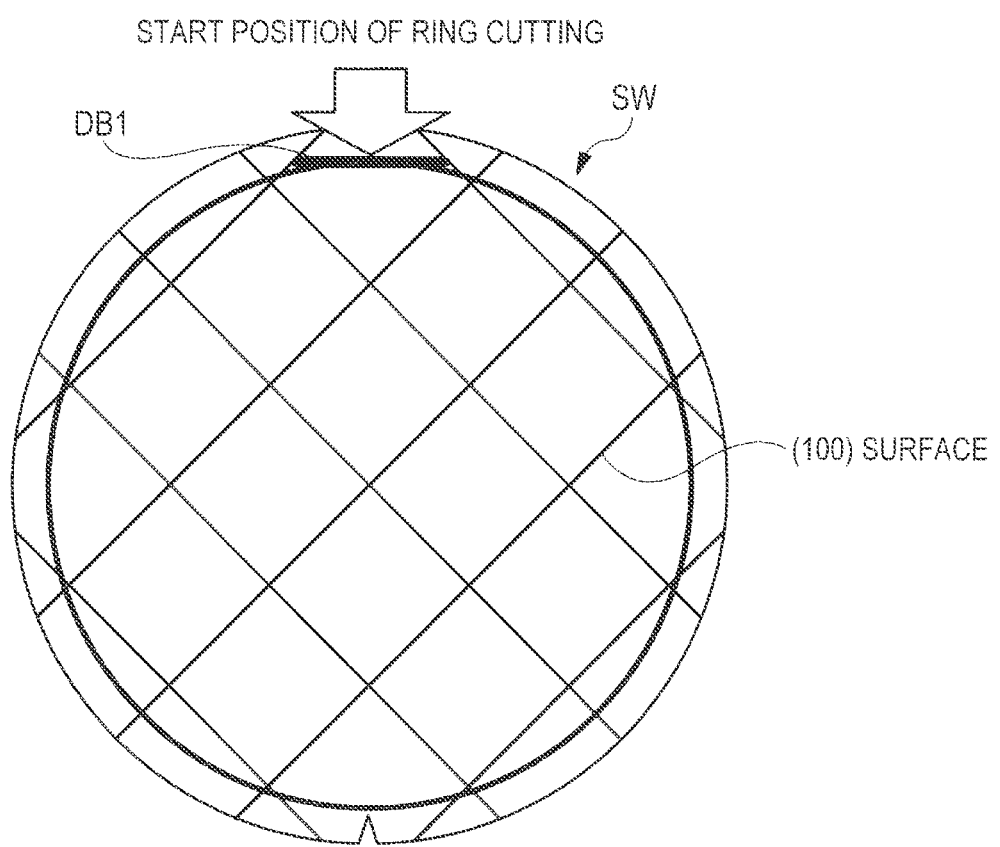
FIG. 28 is a plan view of a semiconductor wafer for use in describing the ring cutting thereof according to a modified example of the embodiment.

The ring cutting of the semiconductor wafer in the TAIKO process according to a modified example of the embodiment will be described using FIG. 28. FIG. 28 is a plan view of a semiconductor wafer for use in describing the ring cutting of the semiconductor wafer according to the modified example of the embodiment.

After the examination by the inventor et al., it is found that all the cracks in a direction of one o'clock occur along the direction of crystal orientation (100)+45° off in the ring-cut semiconductor wafer.

Therefore, as shown in FIG. 28, the ring cutting of the semiconductor wafer SW starts at an angle of 45° inclined to the surface (100). In other words, in the ring cutting, the wafer is not cut along the crystal direction. According to this, even when the triangular chipping occurs in the outer periphery of the ring-cut semiconductor wafer, it is possible to suppress the crack generated in the ring-cut semiconductor wafer from developing.

As mentioned above (refer to FIG. 25), the end surface of the protective film RF on the side of the pattern prohibiting region PNR is positioned in the semiconductor wafer SW inner than the end surface of the conductive pattern ME on the same side. According to this, it is possible to avoid the triangular chipping occurring in the outer periphery of the ring-cut semiconductor wafer and by starting the ring cutting of the semiconductor wafer SW at the angle of 45° inclined to the surface (100), it is possible to suppress the generation of crack.

As mentioned above, the invention made by the inventor et al. has been specifically described based on the embodiments; however, the invention is not restricted to the above embodiments but it is needless to say that various modifications can be made without departing from the spirit.

What is claimed is:

1. A method of manufacturing a semiconductor device, comprising:
   (a) preparing a semiconductor wafer having:
      a device region,
      a dummy region arranged outside the device region to surround the device region in plan view, and
      a pattern prohibiting region arranged outside the dummy region to surround the dummy region in plan view,
   a semiconductor substrate of the semiconductor wafer having:
      a top surface, and
      a bottom surface opposite to the top surface,
   a first conductive pattern formed on the top surface of the semiconductor substrate in the dummy region, and
   a first insulating pattern formed on the first conductive pattern;

(b) after the (a), attaching a first protective tape to the semiconductor wafer so as to cover the device region, and grinding the bottom surface of the semiconductor substrate, thereby thinning a thickness of a portion of the semiconductor substrate, which is located on an inner side of an edge portion of the semiconductor substrate, the edge portion being positioned within the pattern prohibiting region in plan view;

(c) after the (b), peeling off the first protective tape from the semiconductor wafer; and (d) after the (c), attaching a second protective tape to the semiconductor wafer so as to cover the device region, and cutting the semiconductor substrate in the pattern prohibiting region along the edge portion in plan view, thereby separating the edge portion from the portion of the semiconductor wafer, and wherein an end surface of the first conductive pattern, which is facing the pattern prohibiting region side, is positioned closer to the edge portion than an end surface of the first insulating pattern, which is facing the pattern prohibiting region side, and, in a cross-section view, a first distance from an outer periphery of the semiconductor wafer to the end surface of the first insulating pattern is larger than a second distance from the outer periphery of the semiconductor wafer to the end surface of the first conductive pattern.

2. The method according to claim 1,
wherein each measurement of H, X1 and X2 of the semiconductor wafer prepared in the (a) is set to satisfy a relation of "H<X2<(X1−X2)", when:
a thickness of a stack comprised of the first conductive pattern and the first insulating pattern is defined as H,
a distance from a cutting region of the semiconductor substrate removed in the (d) to the end surface of the first insulating pattern is defined as X1, and
a distance from the cutting region to the end surface of the first conductive pattern is defined as X2.

3. The method according to claim 2,
wherein the first insulating pattern is an organic resin film.

4. The method according to claim 2,
wherein the device region includes:
the semiconductor substrate,
a second conductive pattern of a same layer as the first conductive pattern, formed on the semiconductor substrate, and
a second insulating pattern of a same layer as the first insulating pattern, formed on the second conductive pattern, and
wherein an end surface of the second conductive pattern facing the pattern prohibiting region side is covered with the second insulating pattern.

5. The method according to claim 2,
wherein a thickness of the semiconductor substrate after the (b) is 60 μm to 120 μm.

6. The method according to claim 1,
wherein each measurement of H1, H2, X1 and X2 of the semiconductor wafer prepared in the (a) is set to satisfy a relation of "(H1+H2)<X2<(X1−X2)" when:
a thickness of a stack comprised of the first conductive pattern and the first insulating pattern is defined as H1,
a distance from a cutting region of the semiconductor substrate removed in the (d) to the end surface of the first insulating pattern is defined as X1,
a distance from the cutting region to the end surface of the first conductive pattern is defined as X2, and
a thickness of the second protective tape located on the first insulating pattern is defined as H2.

7. The method according to claim 6,
wherein the first insulating pattern is an organic resin film.

8. The method according to claim 6,
wherein the device region includes:
the semiconductor substrate,
a second conductive pattern of a same layer as the first conductive pattern, formed on the semiconductor substrate, and
a second insulating pattern of a same layer as the first insulating pattern, formed on the second conductive pattern, and
wherein an end surface of the second conductive pattern facing the pattern prohibiting region side is covered with the second insulating pattern.

9. The method according to claim 6,
wherein a thickness of the semiconductor substrate after the (b) is 60 μm to 120 μm.

10. The method according to claim 1,
wherein a difference between the first distance and the second distance is 0.4 μm and more.

11. The method according to claim 1,
wherein the first insulating pattern is an organic resin film.

12. The method according to claim 1,
wherein the device region includes:
the semiconductor substrate,
a second conductive pattern of a same layer as the first conductive pattern, formed on the semiconductor substrate, and
a second insulating pattern of a same layer as the first insulating pattern, formed on the second conductive pattern, and
wherein an end surface of the second conductive pattern facing the pattern prohibiting region side is covered with the second insulating pattern.

13. The method according to claim 1,
wherein a thickness of the semiconductor substrate after the (b) is 60 μm to 120 μm.

* * * * *